(12) United States Patent
Murakami

(10) Patent No.: US 12,080,677 B2
(45) Date of Patent: Sep. 3, 2024

(54) BOARD UNIT AND SEMICONDUCTOR DEVICE

(71) Applicant: Kioxia Corporation, Tokyo (JP)

(72) Inventor: Katsuya Murakami, Sumida Tokyo (JP)

(73) Assignee: Kioxia Corporation, Tokyo (JP)

( * ) Notice: Subject to any disclaimer, the term of this patent is extended or adjusted under 35 U.S.C. 154(b) by 221 days.

(21) Appl. No.: 17/693,886

(22) Filed: Mar. 14, 2022

(65) Prior Publication Data
US 2023/0086136 A1 Mar. 23, 2023

(30) Foreign Application Priority Data
Sep. 21, 2021 (JP) .................... 2021-152927

(51) Int. Cl.
*H01L 23/00* (2006.01)
*H01L 25/065* (2023.01)
*H05K 1/11* (2006.01)

(52) U.S. Cl.
CPC .............. *H01L 24/73* (2013.01); *H01L 24/13* (2013.01); *H01L 24/48* (2013.01); *H01L 25/0657* (2013.01); *H05K 1/111* (2013.01); *H01L 2224/13021* (2013.01); *H01L 2224/13028* (2013.01); *H01L 2224/48491* (2013.01);
(Continued)

(58) Field of Classification Search
CPC ......... H01L 24/73; H01L 24/13; H01L 24/48; H01L 25/0657; H01L 2224/13021; H01L 2224/13028; H01L 2224/48491; H01L 2224/73207; H01L 2224/73257; H01L 2225/06506; H01L 2225/0651; H01L 2225/06562; H01L 23/13; H01L 23/49838; H01L 23/49816; H01L 24/97; H01L 25/18; H01L 2224/48091; H01L 2224/48145; H01L 2224/48227; H01L 2224/97; H01L 2924/15311; H01L 2924/181; H01L 2924/19107; H05K 1/111; H05K 3/225;
(Continued)

(56) References Cited

U.S. PATENT DOCUMENTS

| 6,670,556 | B1 | 12/2003 | Suehiro |
| 9,307,686 | B2 | 4/2016 | Takada et al. |
| 2021/0375820 | A1* | 12/2021 | Eid .......................... H01L 24/03 |

FOREIGN PATENT DOCUMENTS

| JP | H10-335810 A | 12/1998 |
| JP | 2002-009209 A | 1/2002 |

* cited by examiner

*Primary Examiner* — Karen Kusumakar
*Assistant Examiner* — Shawn Shaw Muslim
(74) *Attorney, Agent, or Firm* — Foley & Lardner LLP

(57) ABSTRACT

A board unit according to an embodiment includes a circuit board, a semiconductor device, and a wire. The semiconductor device has a bottom surface facing the circuit board. The semiconductor device includes a plurality of bonding members between the circuit board and the bottom surface. The wire is disposed between the circuit board and the bottom surface. The bonding members have a first row and a second row. Two or more bonding members align in the first row in a first direction. Two or more bonding members align in the second row in the first direction. The second row is apart from the first row in a second direction intersecting with the first direction. The wire includes a first portion disposed between the first row and the second row, and the wire has a strength higher than that of one of the bonding members.

20 Claims, 20 Drawing Sheets

(52) U.S. Cl.
CPC ........... *H01L 2224/73207* (2013.01); *H01L 2224/73257* (2013.01); *H01L 2225/06506* (2013.01); *H01L 2225/0651* (2013.01); *H01L 2225/06562* (2013.01)

(58) Field of Classification Search
CPC ............. H05K 1/181; H05K 3/3436; H05K 2201/10734; H05K 2203/176; Y02P 70/50

See application file for complete search history.

BOARD UNIT AND SEMICONDUCTOR DEVICE

CROSS-REFERENCE TO RELATED APPLICATION

This application is based upon and claims the benefit of priority from Japanese Patent Application No. 2021-152927, filed Sep. 21, 2021; the entire contents of which are incorporated herein by reference.

FIELD

Embodiments described herein relate generally to a board unit and a semiconductor device.

BACKGROUND

A semiconductor storage device configured to be mountable on a circuit board is known. A board unit including a semiconductor storage device mounted on a circuit board is also known. Generally, such a semiconductor storage device is mounted on the circuit board via solder. When a board unit is manufactured or repaired, it may be necessary to remove a semiconductor storage device mounted on the circuit board. It is not easy to remove, from the circuit board, the mounted semiconductor storage device that was mounted on the circuit board via solder without applying thermal load. When a board unit is manufactured or repaired, it is required to easily peel the semiconductor storage device from the circuit board.

DETAILED DESCRIPTION

Figure 1:
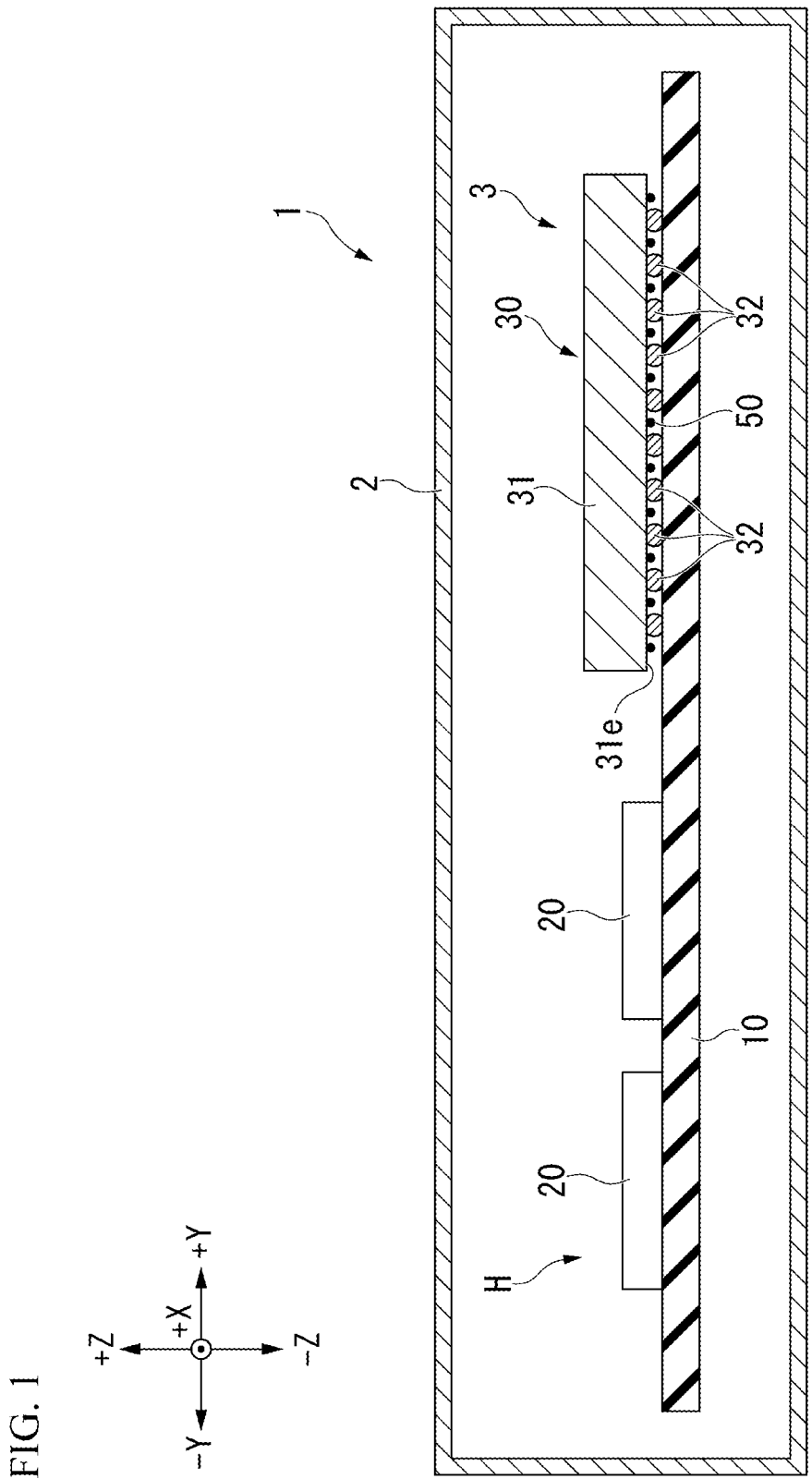
FIG. 1 is a cross-sectional view showing an electronic device according to a first embodiment.

A board unit according to an embodiment includes a circuit board, a semiconductor device, and a wire. The semiconductor device has a bottom surface facing the circuit board. The semiconductor device includes a plurality of bonding members. The plurality of the bonding members are disposed between the circuit board and the bottom surface. The plurality of the bonding members are connected to the circuit board. The wire is disposed between the circuit board and the bottom surface. The plurality of the bonding members have a first row and a second row. Of the plurality of the bonding members, two or more bonding members align in the first row in a first direction. Of the plurality of the bonding members, two or more bonding members align in the second row in the first direction. The second row is apart from the first row in a second direction intersecting with the first direction. The wire includes a first portion disposed between the first row and the second row, and the wire has a strength higher than that of one of the plurality of the bonding members.

Hereinafter, a board unit and a semiconductor storage device according to embodiments will be described with reference to the drawings. In the following description, the same reference numerals are given to components having the same or similar function. Duplicate description of these components may be omitted. The terms "parallel", "perpendicular", and "the same as" may also include "substantially parallel", "substantially perpendicular", and "substantially the same as", respectively. The term "connection" is not limited to "structural connection" but may also include "electrical connection". That is, the term "connection" is not limited to a case in which a plurality of members are directly connected to each other but may also include a case in which a plurality of members are connected to each other via another member. The term "fixation" is not limited to a case in which a plurality of members are directly fixed to each other but may also include a case in which a plurality of members are fixed to each other via another member.

First of all, a +X direction, a —X direction, a +Y direction, a —Y direction, a +Z direction, and a —Z direction will be defined in advance. The +X direction, the —X direction, the +Y direction, and the —Y direction are directions, each of which is along a surface of a circuit board 10 which will be described below. The +X direction is a direction from a fourth side surface 31*d* to a third side surface 31*c* of a semiconductor storage device 30 which will be described below (refer to FIG. 4). The —X direction is a direction opposite to the +X direction. When the +X direction and the −X direction are not distinguished from each other, they will be simply referred to as "the X direction". The +Y direction and the −Y direction are each a direction intersecting with (for example, orthogonal to) the X direction. The +Y direction is a direction from a second side surface 31*b* to a first side surface 31*a* of the semiconductor storage device 30 (refer to FIG. 4). The −Y direction is a direction opposite to the +Y direction. When the +Y direction and the −Y direction are not distinguished from each other, they will be simply referred to as "the Y direction". The +Z direction and the −Z direction are each a direction intersecting with (for example, orthogonal to) the X direction and with the Y direction and are each a thickness direction of the circuit board 10 (refer to FIG. 1). The +Z direction is a direction from the circuit board 10 to the semiconductor storage device 30. The —Z direction is a direction opposite to the +Z direction. When the +Z direction and the −Z direction are not distinguished from each other, they will be simply referred to as "the Z direction". Hereinbelow, for convenience of explanation, a side in the +Z direction may be referred to as "upper", and a side in the −Z direction may be referred to as "lower". However, the aforementioned expressions are not limited to a direction of gravitational force. The X direction is an example of "first direction". The Y direction is an example of "second direction".

First Embodiment

1. Electronic Device

First of all, an electronic device 1 including a board unit 3 will be described.

FIG. 1 is a cross-sectional view showing the electronic device 1 according to a first embodiment. The electronic device 1 is, for example, an information processor such as a notebook personal computer. However, the electronic device 1 is not limited to the above-mentioned example but may be various information processors such as a stationary personal computer, a server device, a mobile digital assistant device, an in-vehicle device, or the like. The electronic device 1 includes, for example, a box-shaped housing 2, and the board unit 3 housed in the housing 2. The board unit 3 includes a semiconductor storage device 30 which will be described below. The semiconductor storage device 30 is capable of storing various information. For this reason, the semiconductor storage device 30 or the board unit 3 may be referred to as "storage device" or "memory system".

2. Board Unit

<2.1 Overall Structure of Board Unit>

Next, the board unit 3 will be described. The board unit 3 includes, for example, a circuit board 10, one or more (for example, a plurality of) electronic components 20, the semiconductor storage device 30, and a wire 50. Note that, the wire 50 may serve as a part of the circuit board 10 or a part of the semiconductor storage device 30.

The circuit board 10 is, for example, a mother board of the electronic device 1. However, the circuit board 10 is not limited to the mother board. The circuit board 10 is, for example, a printed circuit board or a printed-wiring assembly which includes an insulator such as a glass epoxy resin and a wiring pattern. The wiring pattern is a conductor that is provided on a superficial layer of the insulator or that is provided in an inner layer of the insulator.

The electronic component 20 is mounted on the circuit board 10. The electronic component 20 is, for example, a host controller such as a CPU (Central Processing Unit), a host memory, a host bridge, a power supply circuit component, or the like. However, the electronic component 20 is not limited to the above-mentioned example. The circuit board 10 and the electronic component 20 constitutes a part of a host device H.

The semiconductor storage device 30 is mounted on the circuit board 10. The semiconductor storage device 30 is, for example, a storage device configured to store data received from a host controller of the host device H in a nonvolatile state. In the embodiment, the semiconductor storage device 30 is a BGA (Ball Grid Array) semiconductor package. The semiconductor storage device 30 includes a body part 31 and a plurality of solder balls 32. The body part 31 has a bottom surface 31*e* facing the circuit board 10. The solder balls 32 are provided on the bottom surface 31*e* of the body part 31. The semiconductor storage device 30 is an example of "semiconductor device". Note that, a semiconductor device is not limited to the semiconductor storage device 30 but may be, for example, a semiconductor device not having a storage function.

The solder ball 32 is an example of "bonding member". Note that, the bonding member is not limited to the solder balls 32 but may be a bonding member using another material (a gold bump or the like). Furthermore, instead of the plurality of the solder balls 32 (a plurality of bonding members) serving as a part of the semiconductor storage device 30 (semiconductor device), the plurality of the solder balls 32 may be provided as another component different from the semiconductor storage device 30. Hereinbelow, "the bottom surface 31*e* of the body part 31 of the semiconductor storage device 30" may be simply referred to as "the bottom surface 31*e* of the semiconductor storage device 30". The semiconductor storage device 30 will be particularly described below.

The wire 50 is disposed between the circuit board 10 and the bottom surface 31*e* of the semiconductor storage device 30. The wire 50 is used to break the plurality of the solder balls 32 when the semiconductor storage device 30 is peeled from the circuit board 10. The wire 50 will be particularly described below.

<2.2 Semiconductor Storage Device>

Figure 2:
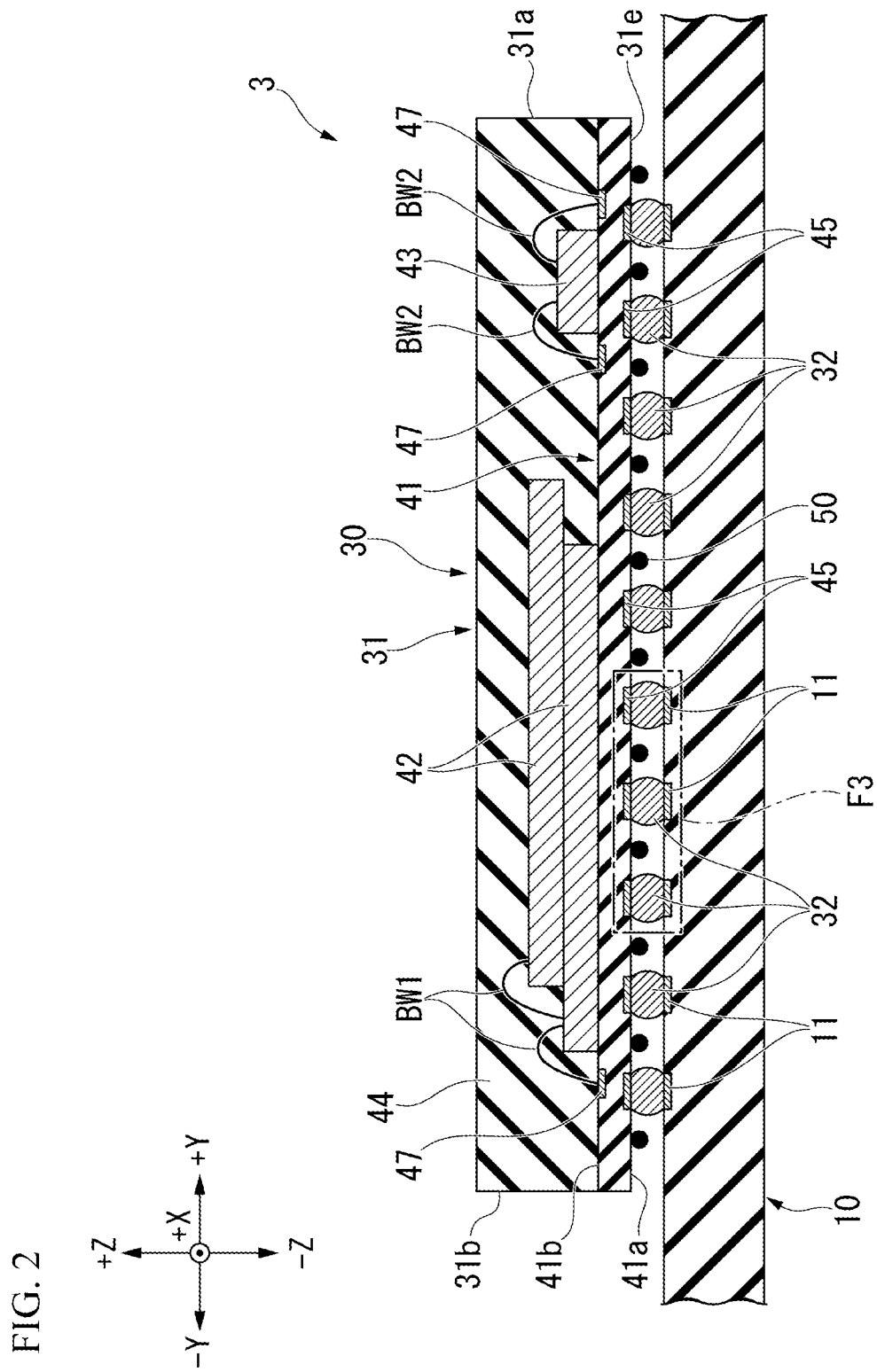
FIG. 2 is a cross-sectional view showing a part of a board unit according to the first embodiment.
Figure 3:
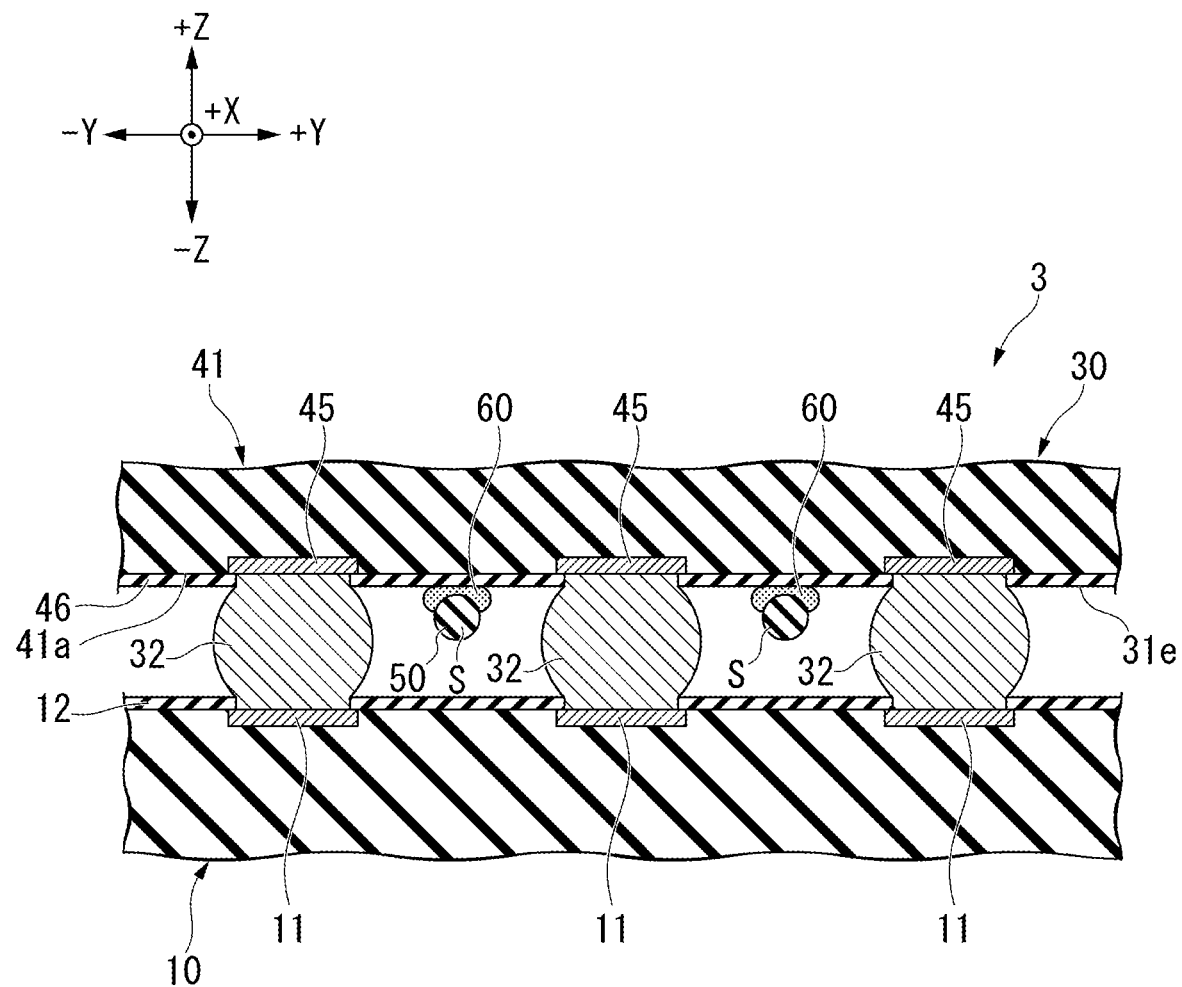
FIG. 3 is an enlarged cross-sectional view showing an area surrounded by line F3 shown in FIG. 2.

FIG. 2 is a cross-sectional view showing a part of the board unit 3. FIG. 3 is an enlarged cross-sectional view showing an area surrounded by line F3 shown in FIG. 2. The circuit board 10 includes a plurality of pads 11 and an insulating layer 12 (for example, a solder resist layer). The plurality of pads 11 are exposed to outside of the circuit board 10. The insulating layer 12 is provided on a surface of the circuit board 10 other than a region corresponding to the plurality of the pads 11.

As described above, the semiconductor storage device 30 includes the body part 31 and the plurality of the solder balls 32. The body part 31 includes, for example, a circuit board 41 (hereinbelow, for distinction, referred to as "package board 41"), one or more semiconductor memory components 42, a controller component 43, and a sealing resin part 44. That is, the semiconductor storage device 30 is a BGA-SSD (Ball Grid Array type Solid State Drive) including the controller component 43. The semiconductor storage device 30 may include a DRAM (Dynamic Random Access Memory). However, the semiconductor storage device 30 is not limited to the above-mentioned example. For example, the semiconductor storage device 30 may be a semiconductor package including one or more semiconductor memory components 42 without including the controller component 43 and the DRAM.

The package board 41 is spaced apart from the circuit board 10 in the Z direction and is disposed parallel to the circuit board 10. The package board 41 is, for example, a printed circuit board or a printed-wiring assembly which includes an insulator such as a glass epoxy resin and a wiring pattern. The wiring pattern is provided on a superficial layer of the insulator or is provided in an inner layer of the insulator. The package board 41 has a first surface 41a and a second surface 41b. The first surface 41a is a surface directed to the −Z direction. The first surface 41a faces the circuit board 10. The second surface 41b is a surface directed to the +Z direction.

A plurality of pads 45 and an insulating layer 46 (for example, a solder resist layer, refer to FIG. 3) are provided on the first surface 41a of the package board 41. The plurality of the pads 45 are exposed to outside of the package board 41. The insulating layer 46 covers the first surface 41a of the package board 41 other than a region corresponding to the plurality of the pads 45. The surfaces of the plurality of the pads 45 and the insulating layer 46 form the bottom surface 31e of the semiconductor storage device 30. A plurality of pads 47 are provided on the second surface 41b of the package board 41.

The semiconductor memory components 42 are mounted on the second surface 41b of the package board 41. In the example shown in FIG. 2, the plurality of the semiconductor memory components 42 are mounted on the second surface 41b of the package board 41 in a state of being stacked to each other in layers. The semiconductor memory components 42 are connected to the plurality of the pads 47 of the second surface 41b of the package board 41 via a plurality of bonding wires BW1. The semiconductor memory component 42 is an example of "semiconductor component".

The controller component 43 is mounted on the second surface 41b of the package board 41. The controller component 43 is connected to the plurality of the pads 47 of the second surface 41b of the package board 41 via a plurality of bonding wires BW2. The controller component 43 includes an interface circuit configured to connect the controller component 43 and the host device H (for an example, a host controller). The controller component 43 is connected to the semiconductor memory components 42 via the bonding wires BW1 and BW2. The bonding wires BW1 and BW2 are included in the package board 41. The controller component 43 is configured to receive a command from the host device H and to execute writing of data, reading of data, and erasing of data with respect to the semiconductor memory component 42 in accordance with the command received from the host device H. The controller component 43 is another example of "semiconductor component".

The sealing resin part 44 is provided on the second surface 41b of the package board 41. The sealing resin part 44 covers the semiconductor memory components 42, the controller component 43, and the bonding wires BW1 and BW2. That is, the sealing resin part 44 seals the semiconductor memory components 42, the controller component 43, and the bonding wires BW1 and BW2. The sealing resin part 44 is referred to as a molded resin part having insulation. The sealing resin part 44 may be referred to as "insulating portion". The sealing resin part 44 is formed of, for example, a material containing a thermosetting resin (epoxy resin or the like) and silica fillers mixed therein.

Figure 4:
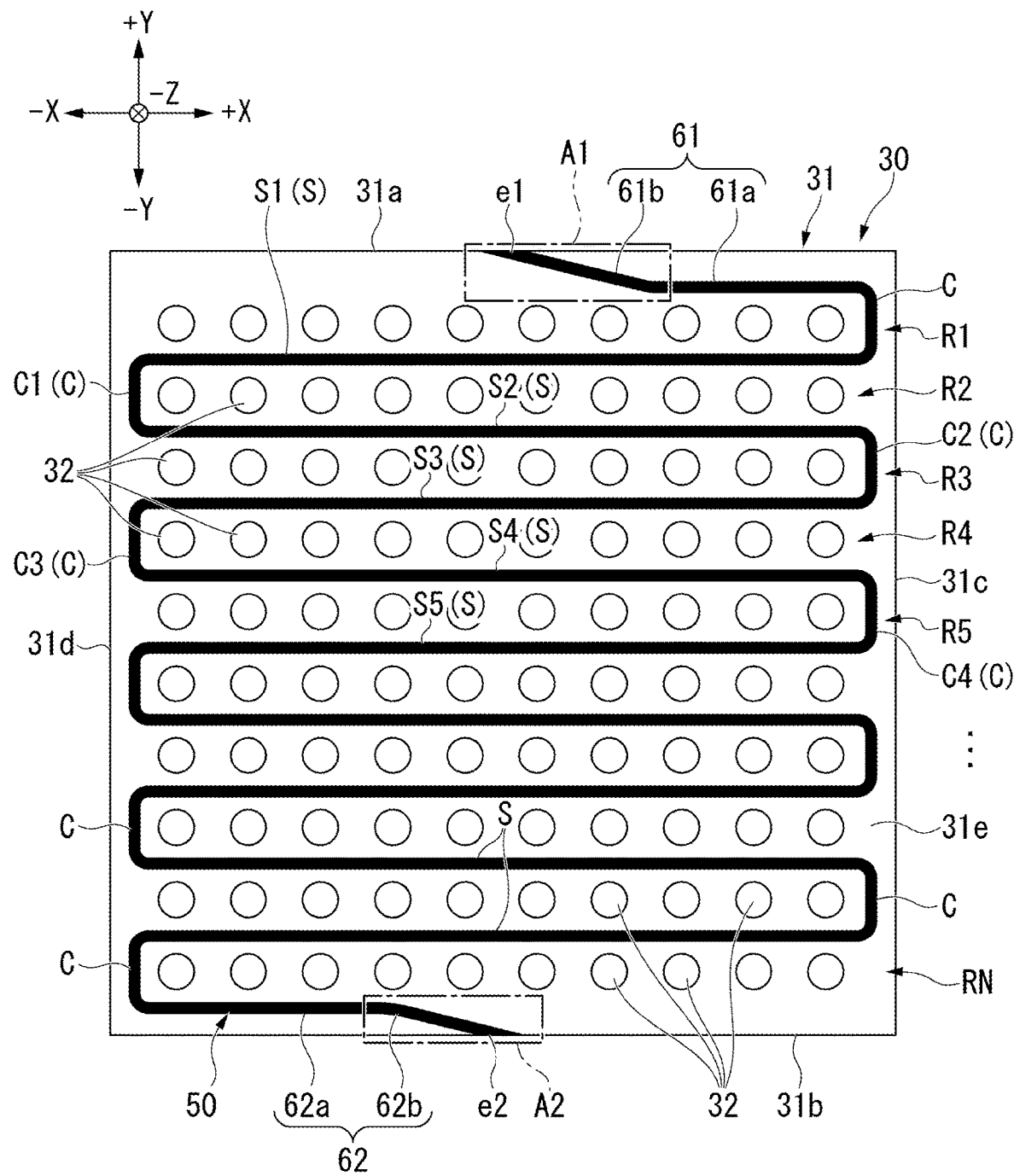
FIG. 4 is a bottom view showing a bottom surface of a semiconductor storage device and a wire according to the first embodiment.

The semiconductor storage device 30 has a first side surface 31a, a second side surface 31b, a third side surface 31c, and a fourth side surface 31d (refer to FIG. 4). Each of the first side surface 31a, the second side surface 31b, the third side surface 31c, and the fourth side surface 31d forms a part of an outer shape of the semiconductor storage device 30. The first side surface 31a is an end face on a side in the +Y direction and extends in the X direction. The second side surface 31b is an end face on a side in the −Y direction and extends in the X direction. The third side surface 31c is an end face on a side in the +X direction and extends in the Y direction. The fourth side surface 31d is an end face on a side in the −X direction and extends in the Y direction. Each of the first side surface 31a, the second side surface 31b, the third side surface 31c, and the fourth side surface 31d includes, for example, an end face of the sealing resin part 44 and an end face of the package board 41.

The plurality of the solder balls 32 are provided so as to be connected to the plurality of the pads 45 of the first surface 41a of the package board 41 in one-to-one correspondence. The plurality of the solder balls 32 are disposed between the circuit board 10 and the package board 41 and are connected to the plurality of the pads 11 of the circuit board 10 in one-to-one correspondence. The plurality of the solder balls 32 are spaced apart at a distance and are arranged in a grid pattern in, for example, the X direction and the Y direction. However, the plurality of the solder balls 32 are not only arranged in a complete grid pattern but also may be partially provided on the first surface 41a of the package board 41. An arrangement layout of the plurality of the solder balls 32 will be particularly described in explanation regarding the wire 50.

<2.3 Wire>

Next, the wire 50 will be described. The wire 50 is disposed between the circuit board 10 and the package board 41 of the semiconductor storage device 30. As described above, the wire 50 is used to break the plurality of the solder balls 32 when the semiconductor storage device 30 is peeled from the circuit board 10. The wire 50 has a strength (for example, a tensile strength ($kgf/mm^2$)) higher than that of each of the solder balls 32 included in the semiconductor storage device 30. In other words, the wire 50 has a strength capable of breaking the solder balls 32. Here, "strength" means, for example, a strength at a normal temperature. The wire 50 may be, for example, a metal wire such as a stainless steel wire or a tungsten wire, a piano wire, an amorphous wire an aramid fiber wire, a carbon fiber wire (for example, a carbon nanotube wire), or the like.

A diameter of the wire 50 is, for example, less than or equal to a half of a diameter of the solder ball 32. For example, when the diameter of the solder ball 32 is 220 (μm), the diameter of the wire 50 is less than or equal to 100 (μm). The "diameter of the solder ball" is the maximum diameter of the solder ball 32 in the X direction (or in the Y direction) in a state in which, for example, the semiconductor storage device 30 is mounted on the circuit board 10.

In the embodiment, for example, the wire 50 has insulation. The "having insulation" may include a case in which an insulating layer is provided on a surface of a wire body formed of a conductive material (for example, a metal material) in addition to a case in which the wire 50 is formed of an insulation material. Note that, instead of the wire 50 having insulation, the wire 50 may have electroconductivity.

The wire 50 may have a high degree of thermal conductivity. For example, the wire 50 includes a material having a coefficient of thermal conductivity higher than that of copper. From another viewpoint, the wire 50 includes a material having a coefficient of thermal conductivity higher than that of a material contained in the sealing resin part 44. The material having a coefficient of thermal conductivity higher than that of copper or the material contained in the sealing resin part 44 is, for example, carbon nanotube. However, a material used to form the wire 50 having a high degree of thermal conductivity is not limited to the above-mentioned example.

As shown in FIG. 3, the wire 50 is fixed on the bottom surface 31e of the semiconductor storage device 30 via, for example, an adhesive 60. In the embodiment, the wire 50 is fixed on a surface of the insulating layer 46 (for example, a solder resist layer) of the semiconductor storage device 30 via the adhesive 60.

FIG. 4 is a bottom view showing the bottom surface 31e of the semiconductor storage device 30 and the wire 50.

Here, an example of an arrangement layout of the plurality of the solder balls 32 will be described. The plurality of the solder balls 32 include, for example, a plurality of solder balls 32 arranged in a first row R1, a plurality of solder balls 32 arranged in a second row R2, a plurality of solder balls 32 arranged in a third row R3, a plurality of solder balls 32 arranged in a fourth row R4, a plurality of solder balls 32 arranged in a fifth row R5, . . . , and a plurality of solder balls 32 arranged in an N-th row RN (N is an integer greater than or equal to six). Hereinbelow, for convenience of explanation, the first row R1, the second row R2, the third row R3, the fourth row R4, the fifth row R5, . . . , and the N-th row RN are referred to as a first ball row R1, second ball row R2, a third ball row R3, a fourth ball row R4, a fifth ball row R5, . . . , and an N-th ball row RN, respectively. Furthermore, the first ball row R1, the second ball row R2, the third ball row R3, the fourth ball row R4, the fifth ball row R5, . . . , and the N-th ball row RN are simply referred to as "ball row R" when they are not distinguished from each other. The plurality of the ball rows R are spaced apart at a distance from each other and align in the Y direction. In each of the ball rows R, the plurality of the solder balls 32 are arranged in the X direction.

In the embodiment, the wire 50 is located between the plurality of the ball rows R (for example, between two ball rows R adjacent to each other of the plurality of the ball rows R). The wire 50 extends in parallel to the two ball rows R while the extending direction of the wire 50 is changed. For example, the wire 50 includes a plurality of straight portions S and a plurality of connection portions C. The straight portions S include a first straight portion S1, a second straight portion S2, a third straight portion S3, a fourth straight portion S4, and a fifth straight portion S5. The connection portions C includes a first connection portion C1, a second connection portion C2, a third connection portion C3, and a fourth connection portion C4.

The first straight portion S1 is disposed between the first ball row R1 and the second ball row R2 in the Y direction and extends in the X direction. The first straight portion S1 extends so as to have a length larger or longer than that of each of the first ball row R1 and the second ball row R2 in the X direction. In other words, the length of the first straight portion S1 in the X direction is longer than the length between the ball 32 located at the end side in the +X direction and the ball 32 located at the end side in the −X direction of each of the first ball row R1 and the second ball row R2. The second straight portion S2 is disposed between the second ball row R2 and the third ball row R3 in the Y direction and extends in the X direction. The second straight portion S2 extends so as to have a length larger or longer than that of each of the second ball row R2 and the third ball row R3 in the X direction. In other words, the length of the second straight portion S2 in the X direction is longer than the length between the ball 32 located at the end side in the +X direction and the ball 32 located at the end side in the −X direction of each of the second ball row R2 and the third ball row R3. The same applies to the other straight portions S. That is, each straight portion S is disposed between the two ball rows R adjacent to each other in the Y direction. Each straight portion S extends in the X direction. Each straight portion S extends so as to have a length in the X direction larger or longer than that of each of the two ball rows R adjacent to each other in the Y direction. In other words, the length of each straight portion S in the X direction is longer than the length between the ball 32 located at the end side in the +X direction and the ball 32 located at the end side in the −X direction of each of the two ball rows R. That is, at each of the side in the +X direction and the side in the −X direction, each straight portion S is arranged to be larger or longer than that of the two ball rows R adjacent to each other in the Y direction. The first straight portion S1 is an example of "first portion". The second straight portion S2 is an example of "second portion".

The first connection portion C1 is located further away from the second ball row R2 on the side in the −X direction. The first connection portion C1 extends in the Y direction. The first connection portion C1 connects the end portion on the side in the −X direction of the first straight portion S1 and the end portion on the side in the −X direction of the second straight portion S2. The second connection portion C2 is located further away from the third ball row R3 on the side in the +X direction. The second connection portion C2 extends in the Y direction. The second connection portion C2 connects the end portion on the side in the +X direction of the second straight portion S2 and the end portion on the side in the +X direction of the third straight portion S3. The third connection portion C3 is located further away from the fourth ball row R4 on the side in the −X direction. The third connection portion C3 extends in the Y direction. The third connection portion C3 connects the end portion on the side in the −X direction of the third straight portion S3 and the end portion on the side in the −X direction of the fourth straight portion S4. The fourth connection portion C4 is located further away from the fifth ball row R5 on the side in the +X direction. The fourth connection portion C4 extends in the Y direction. The fourth connection portion C4 connects the end portion on the side in the +X direction of the fourth straight portion S4 and the end portion on the side in the +X direction of the fifth straight portion S5. The same applies to the other connection portions C. That is, each of the connection portions C is located further away from the ball row R on the side in the +X direction or the side in the −X direction. Each of the connection portions C connects a plurality of portions included in the wire 50 (for example, the straight portion S). The first connection portion C1 is an example of "third portion". In other words, a part of the wire 50 is disposed between the two ball rows R adjacent to each other of the plurality of the ball rows R. Specifically, regarding the route of the wire 50 in the plurality of the ball rows R, a part of the wire 50 passes through between the first ball row R1 and the second ball row R2, curves around the outside of the end portion on the side in the −X direction of the second ball row R2 (at the side in the −X direction), passes through between the second ball row R2 and the third ball row R3, curves around the outside of the end portion on the side in the +X direction of the third ball row R3 (at the side in the +X direction), passes through between the third ball row R3 and the fourth ball row R4, curves around the outside of the end portion on the side in the −X direction of the fourth ball row R4 (at the side in the −X direction), passes through between the fourth ball row R4 and the fifth ball row R5, and curves around the outside of the end portion on the side in the +X direction of the fifth ball row R5 (at the side in the +X direction), and thereafter the wire 50 is disposed between the two ball rows R adjacent to each other of the plurality of the ball rows R while repeating the conversion of the passing direction of the wire 50 in a similar manner described above.

In the embodiment, the wire 50 includes a first end portion 61 and a second end portion 62. When viewed from the side in the Z direction, the first end portion 61 is positioned between the first side surface 31a of the semiconductor storage device 30 and the first ball row R1. The first end portion 61 includes a first portion 61a and a second portion 61b. The first portion 61a extends in the X direction along the first side surface 31a of the semiconductor storage device 30. The first portion 61a is connected to the first straight portion S1 via one connection portion C. The second portion 61b extends inclined with respect to the first portion 61a in a direction from an end of the first portion 61a toward the first side surface 31a of the semiconductor storage device 30. In other words, the extending direction of the second portion 61b is, for example, a direction intersecting with the X direction and the Y direction. When viewed from the Z direction, the second portion 61b reaches the first side surface 31a of the semiconductor storage device 30. For example, when viewed from the Z direction, an end e1 of the second portion 61b matches the first side surface 31a of the semiconductor storage device 30. Note that, the adhesive 60 may not be provided at a first surrounding region A1 located around the second portion 61b of the wire 50 on the bottom surface 31e of the semiconductor storage device 30. Therefore, at least a part of the second portion 61b may be movable with respect to the bottom surface 31e of the semiconductor storage device 30.

When viewed from the side in the Z direction, the second end portion 62 is positioned between the second side surface 31b of the semiconductor storage device 30 and the N-th the ball row RN. The second end portion 62 includes a first portion 62a and a second portion 62b. The first portion 62a extends in the X direction along the second side surface 31b of the semiconductor storage device 30. The first portion 62a is connected to one straight portion S via one connection portion C. The second portion 62b extends inclined with respect to the first portion 62a in a direction from an end of the first portion 62a toward the second side surface 31b of the semiconductor storage device 30. In other words, the extending direction of the second portion 62b is, for example, a direction intersecting with the X direction and the Y direction. When viewed from the Z direction, the second portion 62b reaches the second side surface 31b of the semiconductor storage device 30. For example, when viewed from the Z direction, an end e2 of the second portion 62b matches the second side surface 31b of the semiconductor storage device 30. Note that, the adhesive 60 may not be provided at a second surrounding region A2 located around the second portion 62b on the bottom surface 31e of the semiconductor storage device 30. Accordingly, at least a part of the second portion 62b may be movable with respect to the bottom surface 31e of the semiconductor storage device 30.

3. Method of Manufacturing Board Unit

Next, a method of manufacturing the board unit 3 will be described.

FIGS. 5A to 5D are cross-sectional explanatory views of a method of manufacturing the board unit 3 according to the first embodiment. FIGS. 5A to 5D show examples in which the wire 50 is attached on the bottom surface 31e of the semiconductor storage device 30 after the plurality of the solder balls 32 are provided on the bottom surface 31e.

Figure 5A:
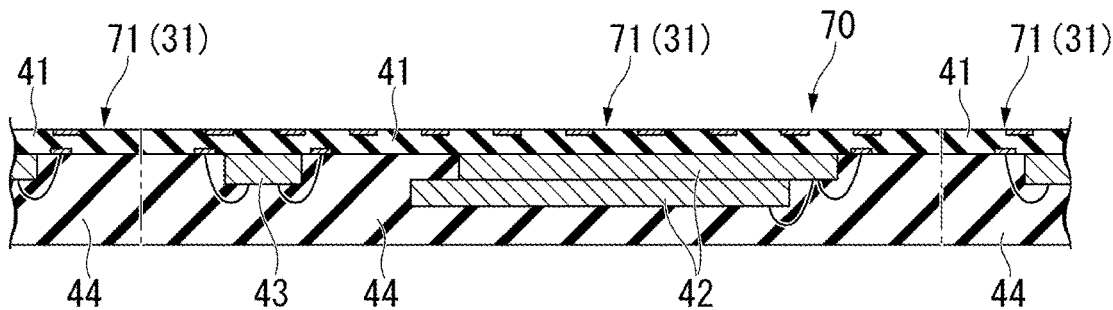
FIGS. 5A to 5D are cross-sectional views for explaining a method of manufacturing the board unit according to the first embodiment.
Figure 5B:
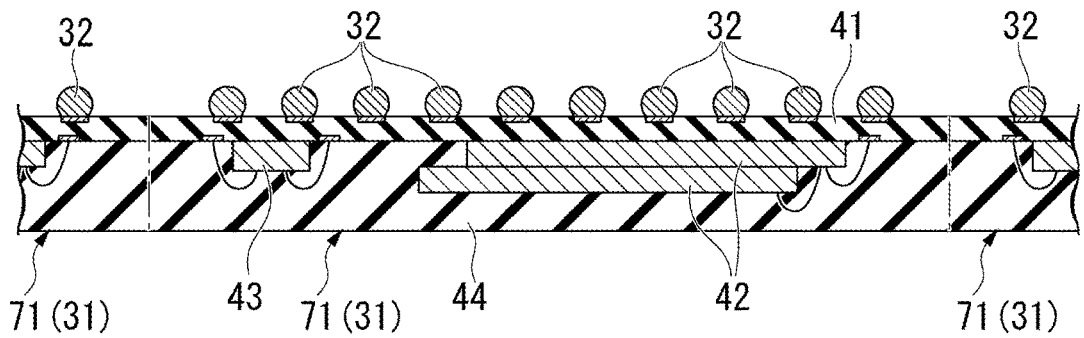

First of all, as shown in FIG. 5A, the structure 70 including a plurality of the production intermediates 71 is prepared by an existing manufacturing method. The production intermediate 71 includes a structure that becomes at least a part of the semiconductor storage device 30. In the embodiment, the production intermediate 71 has the same configuration as that of the body part 31 of the semiconductor storage device 30. The plurality of the production intermediates 71 are linked to each other. That is, the body part 31 is obtained by singulation of the structure 70 into the plurality of the production intermediates 71. Next, as shown in FIG. 5B, the plurality of the solder balls 32 are provided on each of the plurality of the production intermediates 71.

Figure 5C:
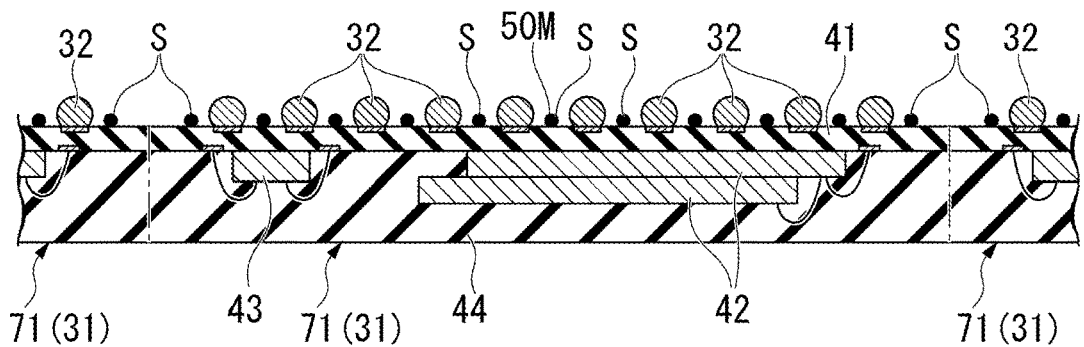

Next, as shown in FIG. 5C, a wire member 50M is attached on surfaces of the plurality of the production intermediates 71. The wire member 50M includes the straight portion S disposed between the two ball rows R adjacent to each other. The wire member 50M is attached so as to bridge the plurality of the production intermediates 71. That is, one series wire member 50M is attached on two or more production intermediates 71. In other words, "one series wire member" may be referred to as "one straight wire member" or "one continuous wire member". This structure will be described below with reference to FIG. 6. Note that, instead of such one series wire member 50M being attached on the two or more production intermediates 71, the wire 50 may be individually attached on each of the production intermediates 71.

Next, dicing for singulation of the structure 70 into the plurality of the production intermediates 71 is carried out. That is, a boundary between the plurality of the production intermediates 71 is cut. Consequently, the wire member 50M is cut at the same time, and a plurality of the wires 50 corresponding one-to-one to a plurality of semiconductor storage devices 30 are obtained from one wire member 50M. As a result, the semiconductor storage device 30 including the wire 50 attached thereto is obtained. Note that, instead of such one series wire member 50M being attached on the two or more production intermediates 71, the wire 50 may be individually attached for each singulated semiconductor storage device 30.

Figure 5D:
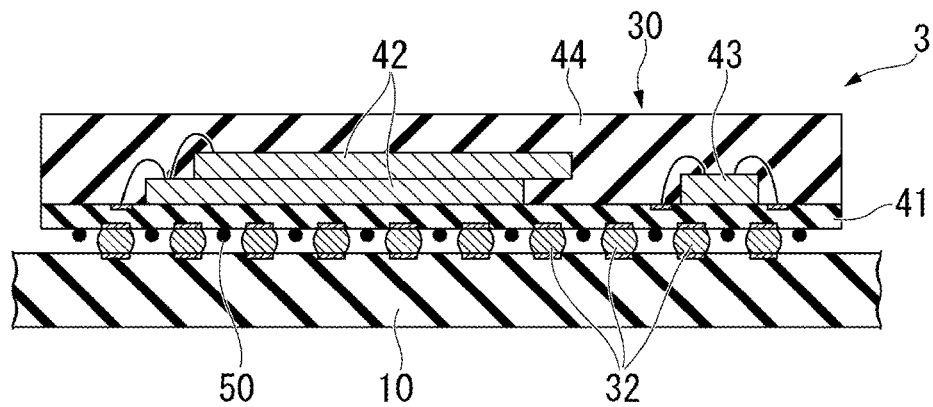

Next, as shown in FIG. 5D, the singulated semiconductor storage device 30 including the wire 50 is mounted on the circuit board 10. Consequently, the board unit 3 is completed.

Figure 6:
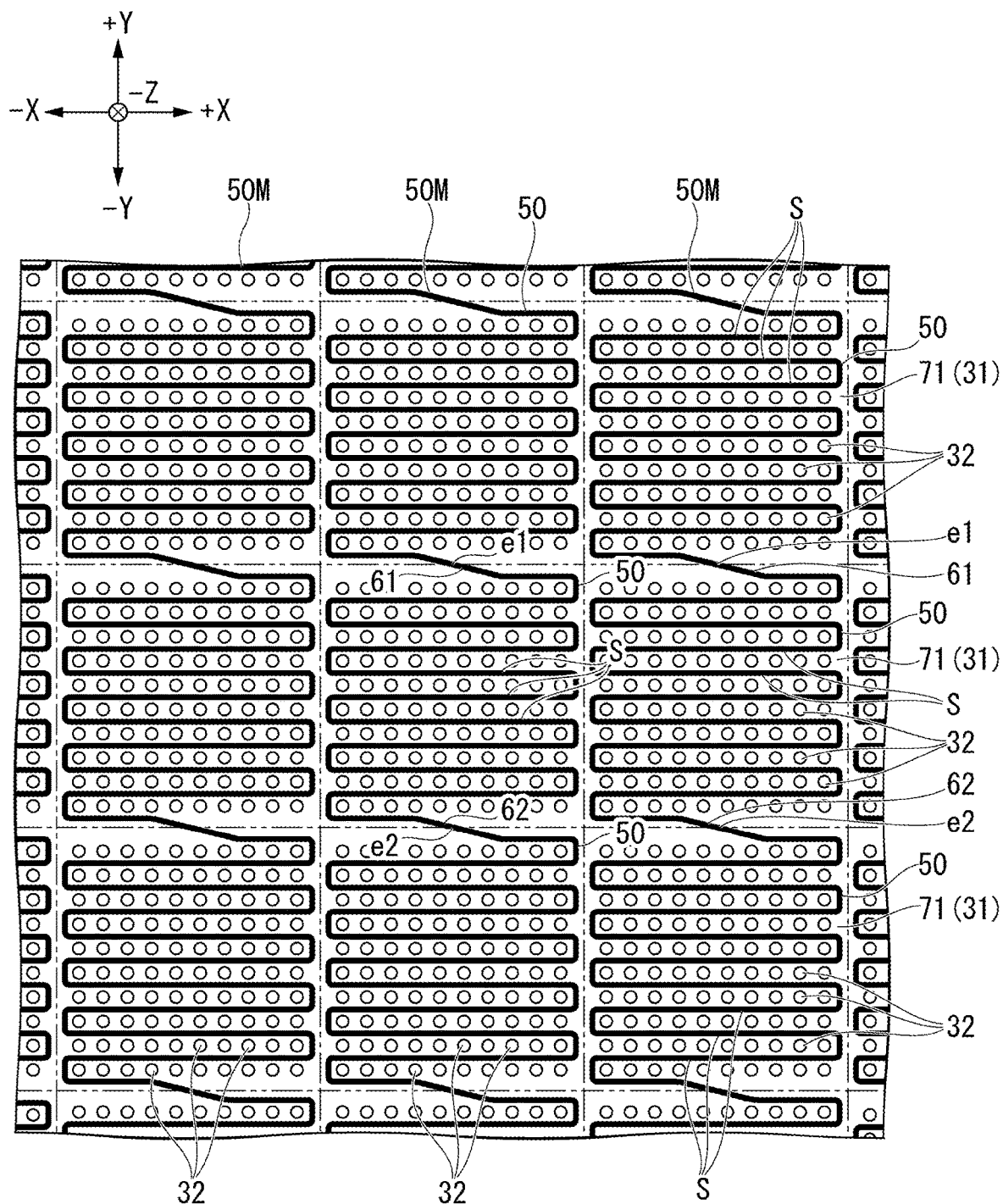
FIG. 6 is a plan view for explaining a method of manufacturing the board unit 110 according to the first embodiment.

FIG. 6 is a plan view for explaining the method of manufacturing the semiconductor storage device 30. FIG. 6 is a view corresponding to the process shown in FIG. 5C. In FIG. 6, a direction from the package board 41 to the plurality of the solder balls 32 in the middle of manufacture of the semiconductor storage device 30 is defined as the −Z direction. In the embodiment, one wire member 50M is attached to the plurality of the production intermediates 71 aligning in the Y direction. In this way, the wire member 50M is cut by singulation via dicing, cutting portions of the wire member 50M are thereby obtained, and the cutting portions of the wire member 50M become the end e1 of the first end portion 61 and the end e2 of the second end portion 62 of the wire 50. According to this manufacturing method, the ends e1 and e2 of the wire 50 reliably match the side surfaces 31a and 31b of the semiconductor storage device 30.

4. Method of Peeling Semiconductor Storage Device

Next, a method of peeling the semiconductor storage device 30 from the circuit board 10 will be described.

Figure 7:
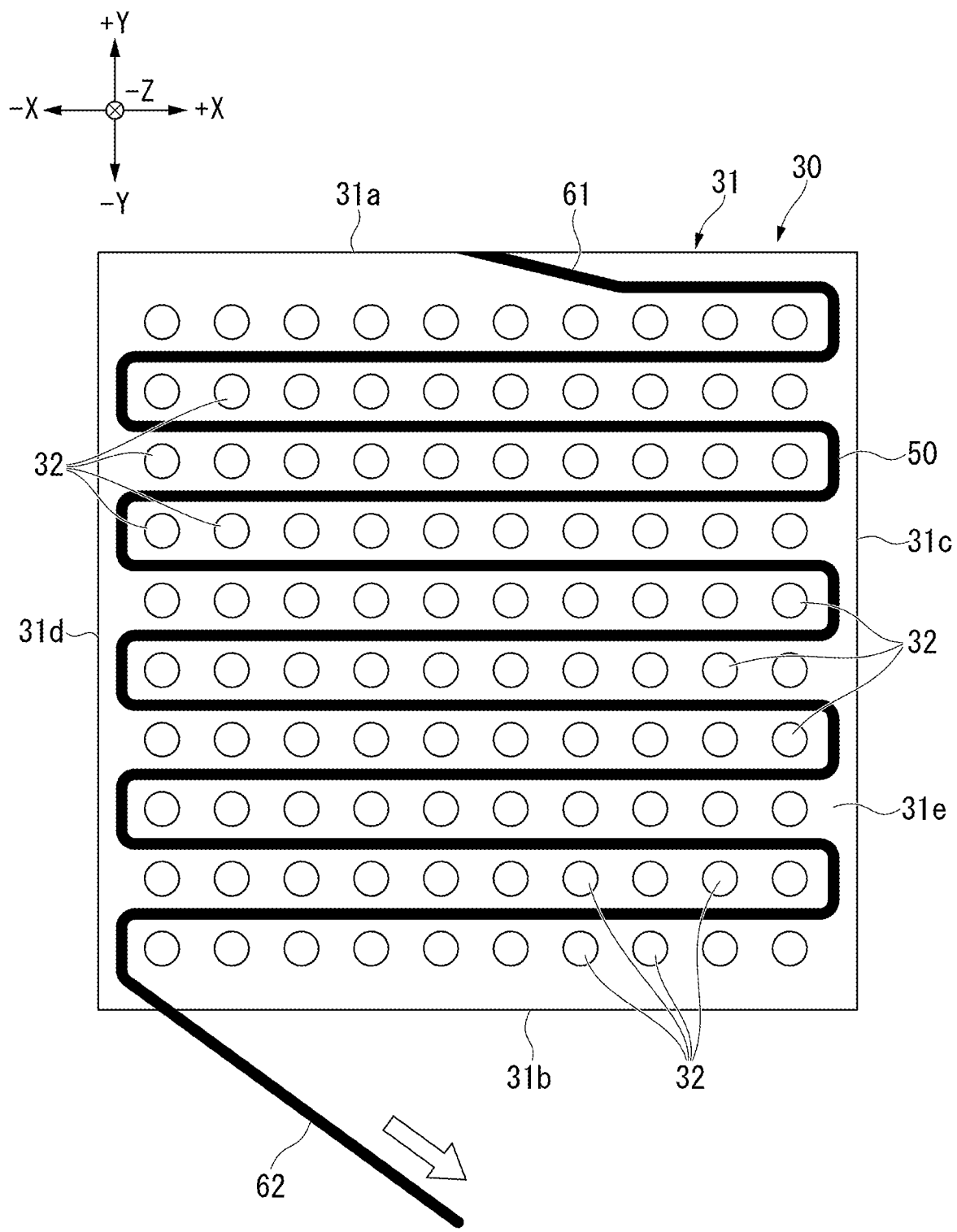
FIG. 7 is a bottom view for explaining a part of method of peeling the semiconductor storage device according to the first embodiment.

FIG. 7 is a bottom view for explaining the method of peeling the semiconductor storage device 30 and is a view showing a peeling preparation state. In the peeling preparation state shown in FIG. 7, for example, the second end portion 62 of the wire 50 is removed from the bottom surface 31e of the semiconductor storage device 30. When viewed from the side in the −Z direction, the second end portion 62 of the wire 50 is drawn from the bottom surface 31e to the outside of the outer shape of the semiconductor storage device 30.

Figure 8:
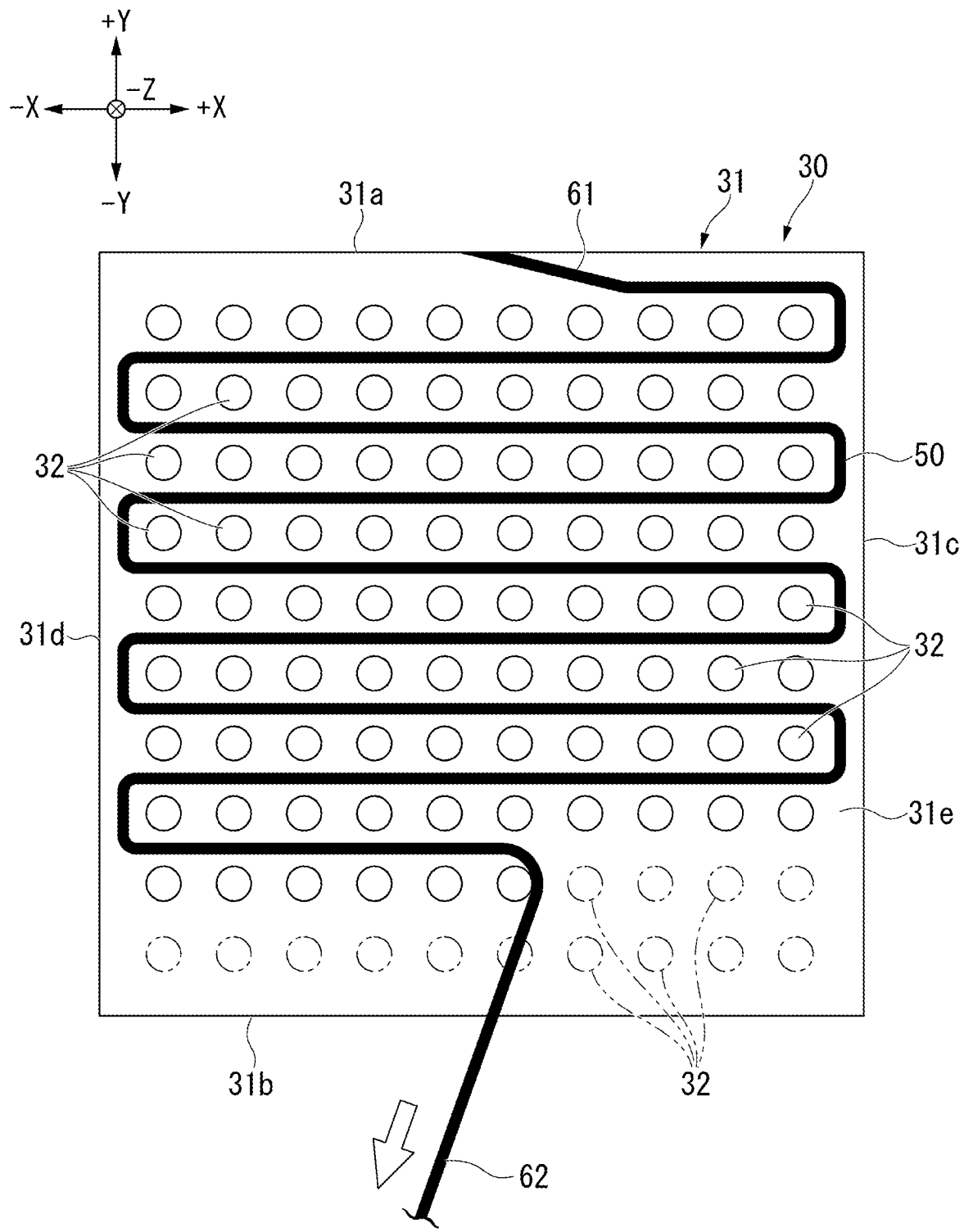
FIG. 8 is a bottom view for explaining another part of a method of peeling the semiconductor storage device according to the first embodiment.

FIG. 8 is a bottom view for explaining the method of peeling the semiconductor storage device 30 and is a view showing a state in which peeling operation is being carried out. In a state in which the peeling operation is being carried out as shown in FIG. 8 as an example, the second end portion 62 of the wire 50 is pulled in a direction to the outside of the semiconductor storage device 30 (for example, pulled in the −Y direction). Accordingly, the plurality of the solder balls 32 provided on the bottom surface 31e of the semiconductor storage device 30 are broken one by one in order (for example, cut off). In FIG. 8, the broken solder balls 32 are shown by an alternate long-dash, two short-dash circle. By continuing this operation, all solder balls 32 are broken, and the semiconductor storage device 30 is peeled off from the circuit board 10. This peeling operation is carried out at, for example, a normal temperature.

5. Advantages

Generally, when a failure occurs in an electronic device or a board unit which includes a semiconductor storage device mounted on a circuit board, the semiconductor storage device is removed from the circuit board, and analyzation of reasons of the failure may be carried out, or relief of data stored in the semiconductor storage device may be carried out. However, for example, a semiconductor memory component is at a high temperature at removal of the semiconductor storage device from the circuit board by heating, a state of data stored in the semiconductor memory component is changed, and the stored data therein may be damaged. Consequently, the operation of removing the semiconductor storage device from the circuit board by heating is not easy, and analyzation of reasons of the failure or relief of data may be difficult.

On the other hand, in the embodiment, the board unit 3 includes the circuit board 10, the semiconductor storage device 30, and the wire 50. The semiconductor storage device 30 includes the bottom surface 31e that faces the circuit board 10, and the plurality of the solder balls 32 connected to the circuit board 10. The plurality of the solder balls 32 have the first row R1 and the second row R2, two or more of the solder balls 32 align in the first row R1 in the X direction, the second row R2 is apart from the first row R1 in the Y direction, and two or more of the solder balls 32 align in the second row R2 in the X direction. The wire 50 is disposed between the circuit board 10 and the bottom surface 31e of the semiconductor storage device 30. The wire 50 includes the first straight portion S1 disposed between the first row R1 and the second row R2, and the wire 50 has a strength higher than that of one solder ball 32 of the plurality of the solder balls 32.

With this configuration, when removal of the semiconductor storage device 30 from the circuit board 10 is necessary, the solder balls 32 are broken by pulling the wire 50, and it is possible to remove the semiconductor storage device 30 from the circuit board 10. For this reason, it is possible to remove the semiconductor storage device 30 from the circuit board 10 while preventing damage to the data stored in the semiconductor memory component 42. As a result, it is possible to easily carry out analyzation of reasons of the failure or relief of data. Furthermore, according to this configuration, the board unit 3 has advantages in cost, electrical characteristics, and heat characteristics as compared to a case in which an LGA (Land Grid Array) semiconductor package is removably mounted on a circuit board via an exclusively used socket.

In the embodiment, the plurality of the solder balls 32 includes the third row R3. The third row R3 is located at the opposite side of the first row R1 with respect to the second row R2 in the Y direction. In the third row R3, two or more of the solder balls 32 align in the X direction. The wire 50 includes the second straight portion S2 and the first connection portion C1. The second straight portion S2 is disposed between the second row R2 and the third row R3. The first connection portion C1 connects the end portion of the first straight portion S1 and the end portion of the second straight portion S2. With this configuration, the wire 50 extends while being folded. For example, regarding a pattern of the wire 50 formed on the board unit 3, a pattern such that the wire 50 extends in the +X direction, is folded at a connection portion, extends in the −X direction, and is folded at another connection portion is repeatedly formed. Accordingly, it is possible to break the solder balls 32 included in the plurality of the rows R using a very small number of the wires 50 (for example, the number of the wires is one) less than that of a case in which a plurality of wires are provided so as to correspond one-to-one to a plurality of rows R. Furthermore, since the wire 50 extends while being folded, it is possible to break the solder balls 32 included in the plurality of the rows R by pulling the wire 50 in one direction (for example, the −Y direction in FIG. 8). Consequently, it is possible to increase a degree of workability of the peeling operation of the semiconductor storage device 30 from the circuit board 10.

In the embodiment, the wire 50 is fixed on the bottom surface 31e of the semiconductor storage device 30. With this configuration, the wire 50 is less likely to interfere with operation of connecting the solder balls 32 of the semiconductor storage device 30 to the circuit board 10. Accordingly, it may be possible to improve manufacturability of the board unit 3.

In the embodiment, when viewed from the Z direction, the wire 50 reaches the first side surface 31a of the semiconductor storage device 30. With this configuration, when removal of the semiconductor storage device 30 from the circuit board 10 is necessary, it is easy to extract the end portion of the wire 50 to an outer periphery of the semiconductor storage device 30. Consequently, it is possible to further increase a degree of workability of the peeling operation of the semiconductor storage device 30 from the circuit board 10.

In the embodiment, the wire 50 has insulation. With this configuration, it is possible to reduce a probability of short-circuiting between the wire 50 and the solder balls 32. Moreover, the wire 50 serves as an insulating member, insulation between the solder balls 32 adjacent to the wire 50 is thereby ensured, and it is possible to prevent occurrence of short-circuiting between the plurality of the solder balls 32. Therefore, it is possible to increase a process yield or reliability of the board unit 3.

In the embodiment, the wire 50 may include a material having a coefficient of thermal conductivity higher than that of a material contained in the sealing resin part 44. With this configuration, it is possible to apply heat to the solder balls 32 by heating the wire 50 while pulling the end portion of the wire 50 (for example, the first end portion 61 or the second end portion 62). For this reason, breaking of the solder balls 32 may be easier than the case of carrying out peeling operation without heating the wire 50. Consequently, it may be possible to further increase a degree of workability of the peeling operation of the semiconductor storage device 30 from the circuit board 10.

In the embodiment, the structure 70 including the plurality of the production intermediates 71 is prepared. Each of the production intermediates 71 becomes at least a part of the semiconductor storage device 30. In this way, the wire member 50M is attached on the surface of the structure 70 so as to bridge the plurality of the production intermediates 71. Furthermore, the structure 70 is singulated into the plurality of the production intermediates 71 while cutting the wire member 50M, and therefore the semiconductor storage device 30 including the wire 50 attached thereon is obtained. With this configuration, since it is possible to attach the wire 50 to the plurality of the semiconductor storage devices 30 at one time, it is possible to increase a degree of manufacturability of the board unit 3 as compared to the case of individually attaching a wire 50 to the plurality of the semiconductor storage devices 30. Additionally, according to the aforementioned manufacturing method, since the ends e1 and e2 of the wire 50 match the side surfaces 31a and 31b of the semiconductor storage device 30, respectively, it is easy to extract the end portion of the wire 50 to the outer periphery of the semiconductor storage device 30. Consequently, it is possible to further increase a degree of workability of the peeling operation of the semiconductor storage device 30 from the circuit board 10.

Modified Example of Manufacturing Method

Next, a method of manufacturing the board unit 3 according to a modified example will be described.

FIGS. 9A to 9D are cross-sectional explanatory views of a method of manufacturing the board unit 3 according the modified example. FIGS. 9A to 9D show examples in which the plurality of the solder balls 32 are provided on the bottom surface 31e after the wire 50 is attached on the bottom surface 31e of the semiconductor storage device 30. Processes other than those described below are the same as in the first embodiment.

Figure 9A:
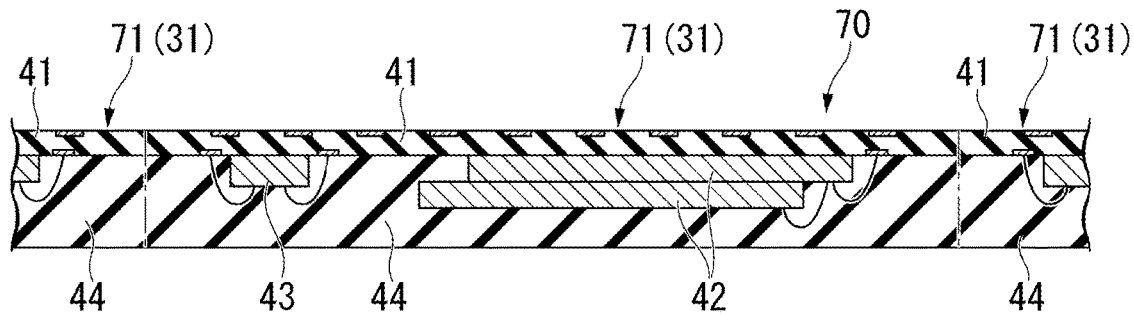
FIGS. 9A to 9D are cross-sectional views for explaining a method of manufacturing the board unit according to a modified example of the first embodiment.

First of all, as shown in FIG. 9A, the structure 70 including a plurality of the production intermediates 71 is prepared. The process up to here is the same as in the first embodiment.

Figure 9B:
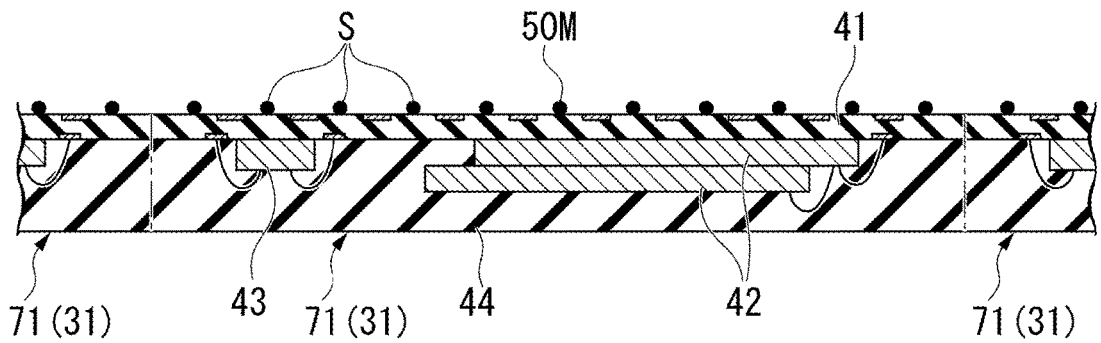

Next, as shown in FIG. 9B, the wire member 50M is attached on the surfaces of the plurality of the production intermediates 71. The wire member 50M includes the straight portion S disposed between the two ball rows R adjacent to each other. The wire member 50M is attached so as to bridge the plurality of the production intermediates 71. That is, one series wire member 50M is attached on two or more production intermediates 71. In other words, "one series wire member" may be referred to as "one straight wire member" or "one continuous wire member". Explanation regarding this structure is the same as the explanation with reference to FIG. 6. Note that, instead of such one series wire member 50M being attached on the two or more production intermediates 71, the wire 50 may be individually attached on each of the production intermediates 71. In the modified example, the plurality of the solder balls 32 are not provided on the plurality of the production intermediates 71 at the point in time when the wire member 50M is attached on the plurality of the production intermediates 71. Consequently, the adhesive 60 that fixes the wire member 50M thereto can be applied to the surfaces of the plurality of the production intermediates 71 by, for example, screen printing.

Figure 9C:
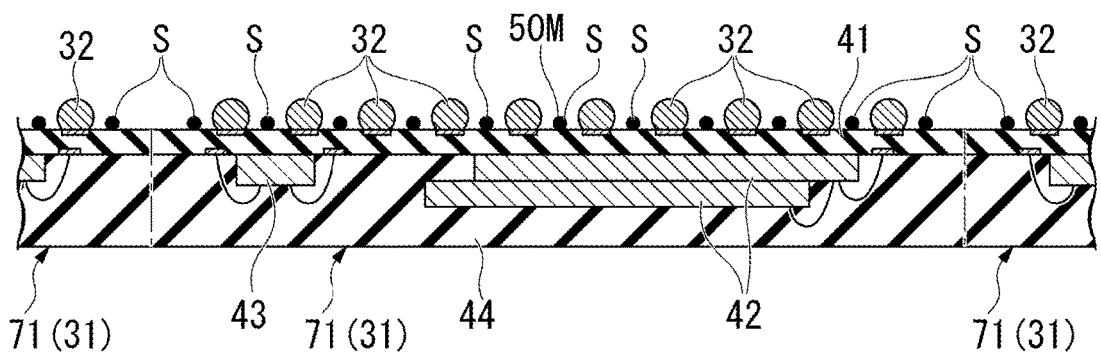

Next, as shown in FIG. 9C, the plurality of the solder balls 32 are provided on each of the plurality of the production intermediates 71. For example, the solder balls 32 having flux adhered thereto are mounted on the production intermediate 71 and are subjected to reflow, and therefore the solder balls 32 are provided between the plurality of the straight portions S included in the wire member 50M.

Next, dicing for singulation of the structure 70 into the plurality of the production intermediates 71 is carried out. That is, a boundary between the plurality of the production intermediates 71 is cut. Consequently, the wire member 50M is cut at the same time, and the plurality of the wires 50 corresponding one-to-one to the plurality of the semiconductor storage devices 30 are obtained from one wire member 50M. As a result, the semiconductor storage device 30 including the wire 50 attached thereto is obtained.

Figure 9D:
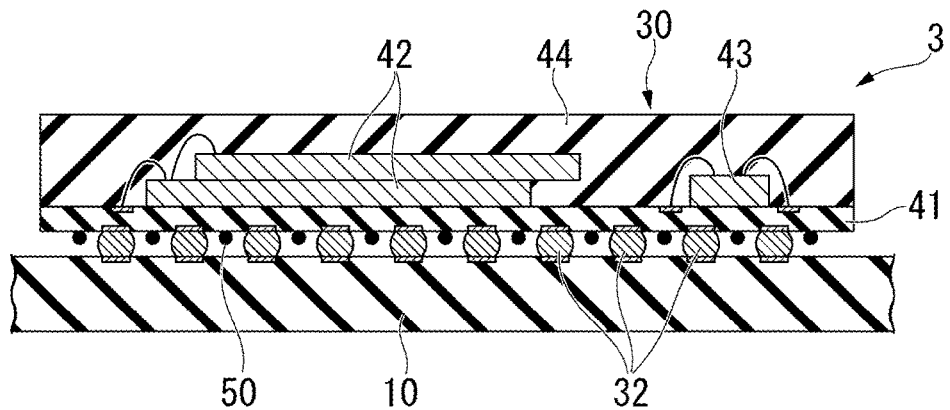

Next, as shown in FIG. 9D, the singulated semiconductor storage device 30 and the wire 50 are mounted on the circuit board 10. Consequently, the board unit 3 is completed.

According to the above-described configuration, it is possible to form the board unit 3 that is the same as that of the first embodiment. In the manufacturing method according to the modified example, the adhesive 60 that fixes the wire member 50M thereto can be applied to the surfaces of the plurality of the production intermediates 71 by, for example, screen printing at the same time. Accordingly, it may be possible to improve manufacturability of the board unit 3.

Second Embodiment

Next, a second embodiment will be described. The second embodiment is different from the first embodiment in that an adhesive sheet 80 having at least a part of the wire 50 implanted therein is provided on the bottom surface 31e of a semiconductor storage device 30A. Configurations other than those described below are the same as in the first embodiment.

Figure 10:
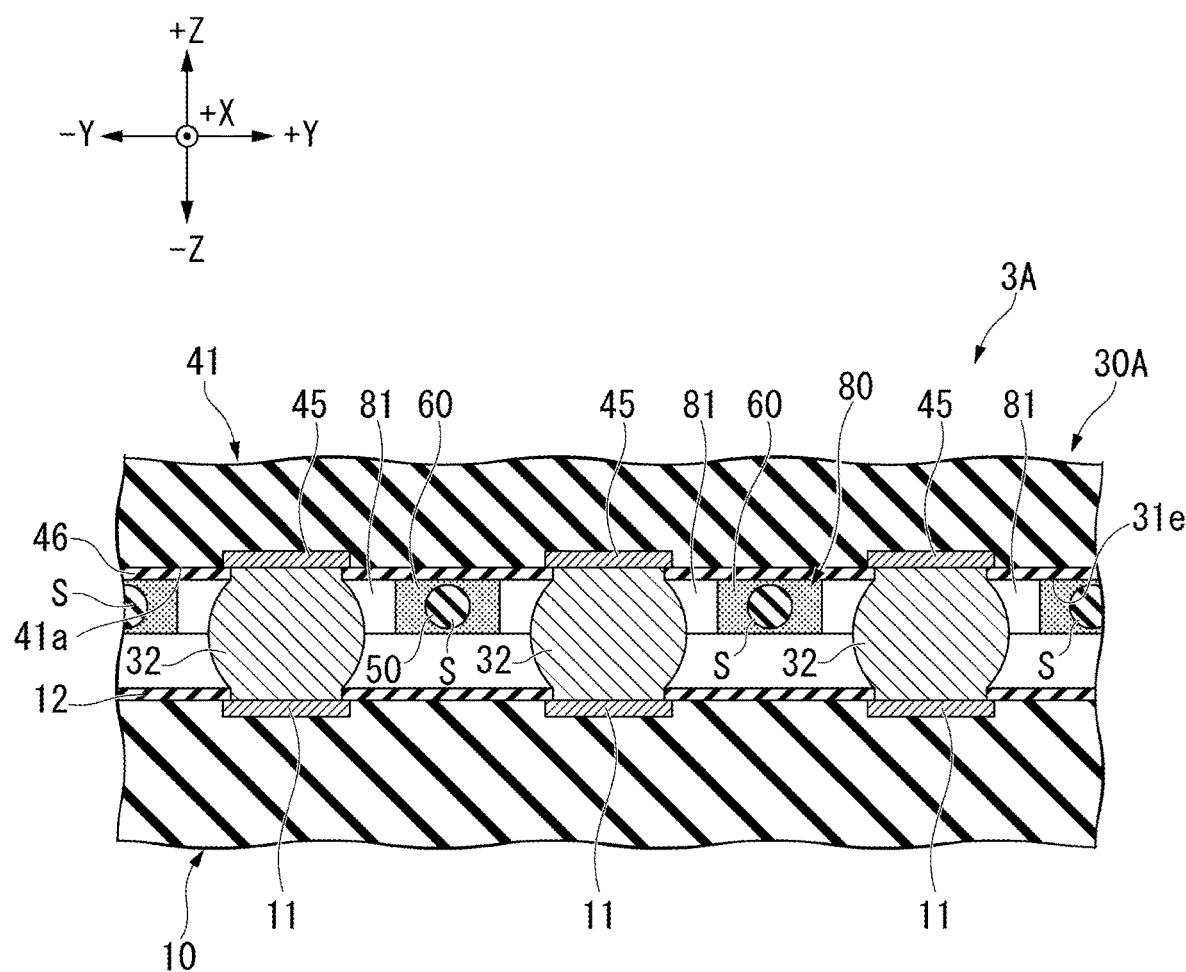
FIG. 10 is a cross-sectional view showing a part of a board unit according to a second embodiment.

FIG. 10 is a cross-sectional view showing a part of a board unit 3A according to the second embodiment. In the embodiment, the adhesive sheet 80 is provided on the bottom surface 31e of the semiconductor storage device 30A. The adhesive sheet 80 is formed in a sheet shape having sides along the X direction and the Y direction. The adhesive sheet 80 includes the adhesive 60. In the embodiment, at least a part of the wire 50 is implanted in the inside of the adhesive sheet 80 (i.e., the inside of the adhesive 60). In the example shown in FIG. 10, the entire wire 50 is implanted in the adhesive sheet 80. Note that, instead of a part or an entirety of the wire 50 being implanted in the adhesive sheet 80, the wire 50 may be attached on the adhesive sheet 80 by being mounted on a surface of the adhesive sheet 80.

The adhesive sheet 80 includes a plurality of opening portions 81. The plurality of the opening portions 81 are disposed at positions corresponding one-to-one to the plurality of the solder balls 32. Each of the opening portions 81 has a size such that one solder ball 32 can pass through one opening portion in the Z direction. The "solder ball can pass through" means that the solder ball 32 can pass through each of the opening portions 81 in a state in which the solder balls 32 are provided on the package board 41 in advance. Accordingly, the adhesive sheet 80 can be provided on the package board 41 while preventing the solder balls 32 and the adhesive sheet 80 from interfering with each other. When viewed from the Z direction, the shape of the opening portion 81 may be a rectangular shape or a circular shape. The opening portion 81 may have a size such that two or more of the solder balls 32 can pass through one opening portion in the Z direction. In the embodiment, as the adhesive sheet 80 having at least a part of the wire 50 implanted therein is provided on the bottom surface 31e of the semiconductor storage device 30A, the wire 50 is fixed on the bottom surface 31e of the semiconductor storage device 30A.

Figure 11A:
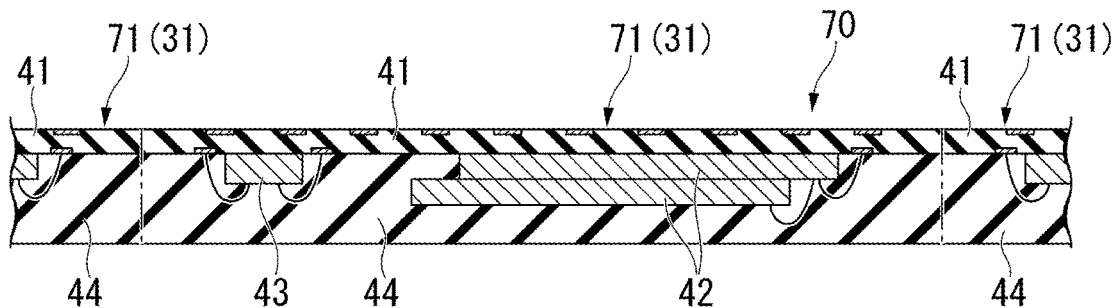
FIGS. 11A to 11D are cross-sectional views for explaining a method of manufacturing the board unit according to the second embodiment.
Figure 11B:
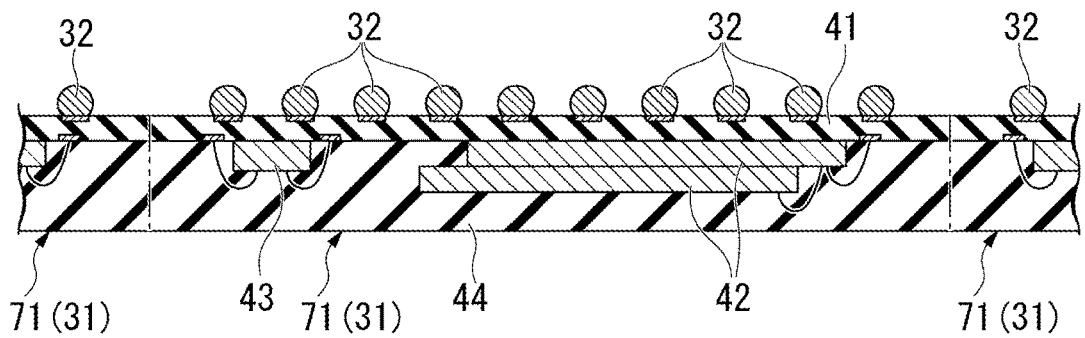

FIGS. 11A to 11D are cross-sectional explanatory views of a method of manufacturing the board unit 3A according to the second embodiment. First of all, as shown in FIG. 11A, a structure 70 including a plurality of production intermediates 71 is prepared by an existing manufacturing method. Next, as shown in FIG. 11B, the plurality of the solder balls 32 are provided for each of the plurality of the production intermediates 71. The processes up to here are the same as in the above-mentioned first embodiment (refer to FIGS. 5A to 5D).

Figure 11C:
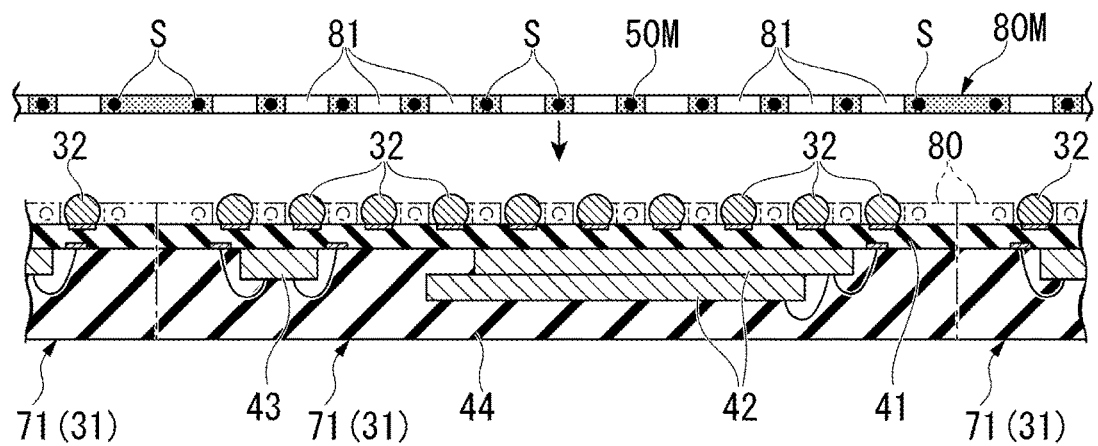

Next, as shown in FIG. 11C, an adhesive sheet 80M including a plurality of adhesive sheets 80 is provided on the plurality of the production intermediates 71. At least a part of the wire member 50M is implanted in the adhesive sheet 80M in advance. Consequently, the wire member 50M provided integrally with the adhesive sheet 80M is potable and attachable to the production intermediates 71. The adhesive sheet 80M has an outer shape covering the plurality of the production intermediates 71 and has the plurality of the opening portions 81. The adhesive sheet 80M is provided on the surfaces of the plurality of the production intermediates 71 while one or more solder balls 32 pass through each of the opening portions 81. In the embodiment, as the adhesive sheet 80M is provided on the surfaces of the plurality of the production intermediates 71, the wire member 50M is fixed to the plurality of the production intermediates 71. In the embodiment, after the adhesive sheet 80M is provided on the surfaces of the plurality of the production intermediates 71, dicing for singulation of the structure 70 into the plurality of the production intermediates 71 is carried out. That is, a boundary between the plurality of the production intermediates 71 is cut. Because of this, the adhesive sheet 80M and the wire member 50M are cut at the same time, the plurality of cutout adhesive sheets 80 corresponding one-to-one to a plurality of semiconductor storage devices 30A are obtained from one adhesive sheet 80M, and the plurality of the wires 50 corresponding one-to-one to the plurality of the semiconductor storage devices 30A are obtained from one wire member 50M. As a result, the semiconductor storage device 30A including the wire 50 attached thereto is obtained.

Figure 11D:
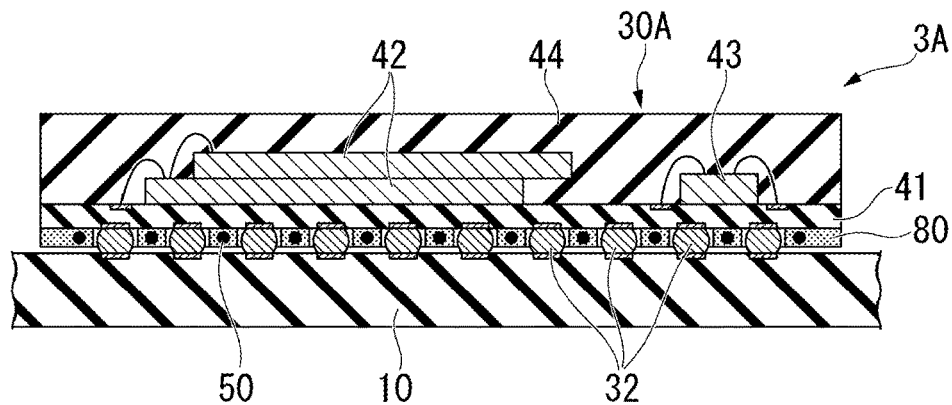

Next, as shown in FIG. 11D, the singulated semiconductor storage device 30A including the wire 50 is mounted on the circuit board 10. Consequently, the board unit 3A is completed.

According to the above-described configuration, it is possible to obtain the board unit 3A that is the same as the board unit 3 according to the first embodiment. In the embodiment, the wire 50 together with the adhesive sheet 80 is provided on the bottom surface 31e of the semiconductor storage device 30A. With this configuration, even when the solder balls 32 are provided on the bottom surface 31e of the semiconductor storage device 30A in advance, it is possible to easily attach the wire 50 on the semiconductor storage device 30A. Therefore, it is possible to increase a degree of manufacturability of the board unit 3A.

Note that, instead of the adhesive sheet 80M being provided on the plurality of the production intermediates 71, the adhesive sheet 80 may be individually provided on the production intermediates 71 in one-to-one correspondence. Furthermore, the adhesive sheet 80 may be individually provided on each semiconductor storage device 30A obtained by dicing. Moreover, the adhesive sheet 80M or the adhesive sheet 80 may be provided on the production intermediate 71 before the plurality of the solder balls 32 are provided on the production intermediate 71.

Third Embodiment

Next, a third embodiment will be described. The third embodiment is different from the first embodiment in that a groove 31g is provided on the bottom surface 31e of a semiconductor storage device 30B. Configurations other than those described below are the same as in the first embodiment.

Figure 12:
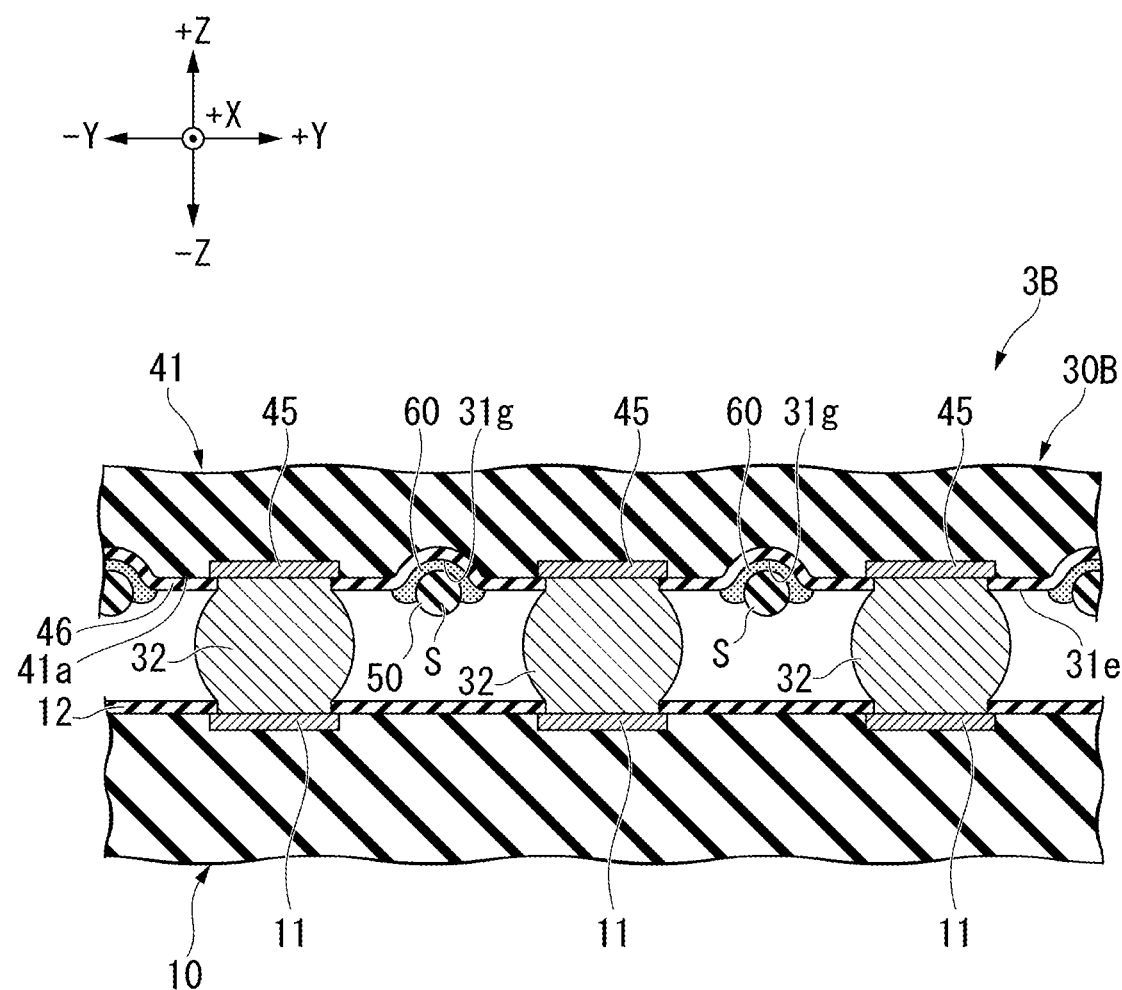
FIG. 12 is a cross-sectional view showing a part of a board unit according to a third embodiment.

FIG. 12 is a cross-sectional view showing a part of a board unit 3B according to the third embodiment. In the embodiment, the bottom surface 31e of the semiconductor storage device 30B has the groove 31g. The groove 31g is provided at a position at which the wire 50 is attached. The groove 31g is depressed in a direction away from the circuit board 10 (+Z direction). That is, the groove 31g is depressed from the bottom surface 31e of the semiconductor storage device 30B toward the inside of the package board 41 in a thickness direction (Z direction). For example, a part of the adhesive 60 and a part of the wire 50 are accommodated in the groove 31g.

Figure 13:
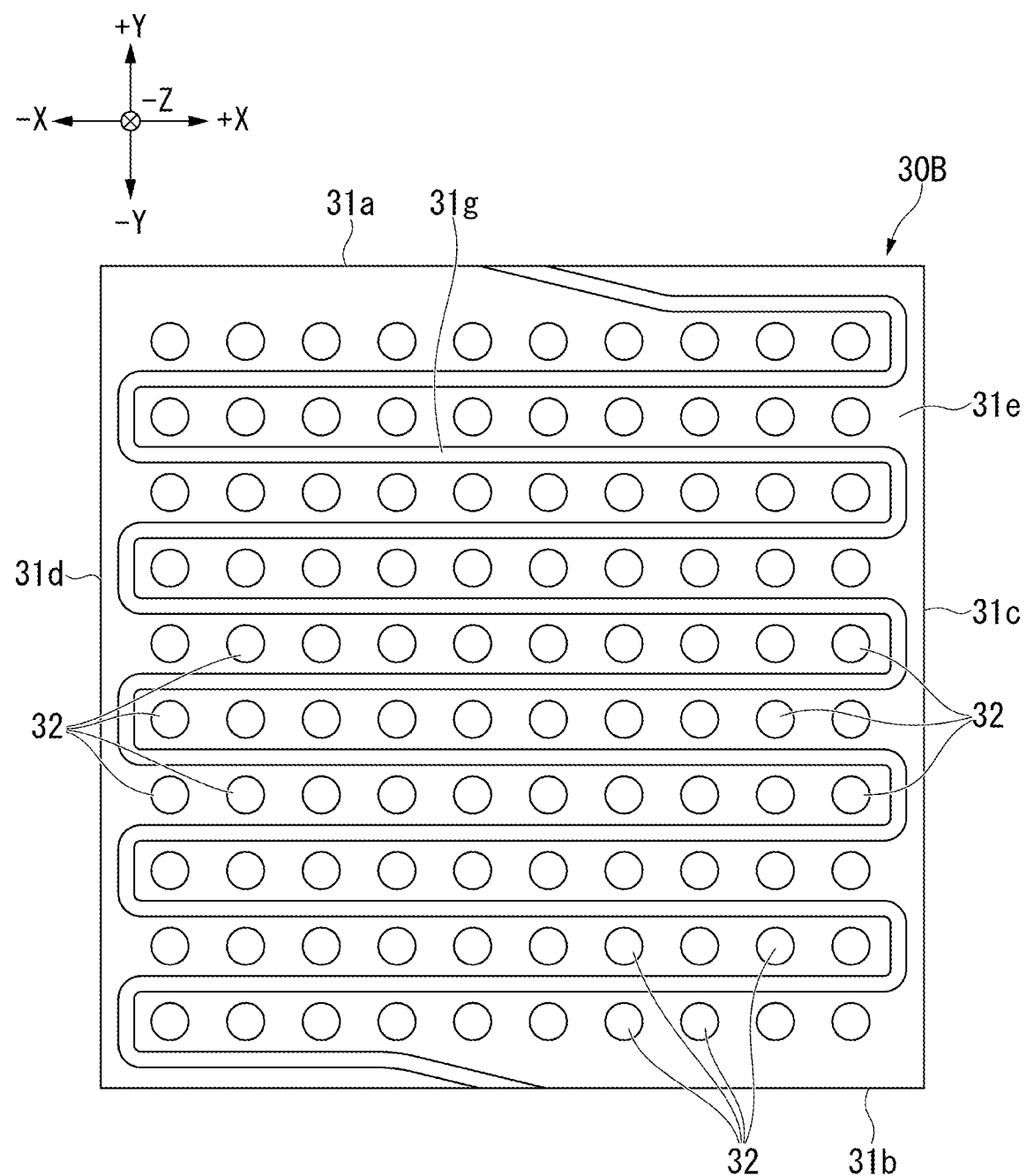
FIG. 13 is a bottom view showing a bottom surface of the semiconductor storage device according to the third embodiment.

FIG. 13 is a bottom view showing the bottom surface 31e of the semiconductor storage device 30B according to the third embodiment. FIG. 13 shows a state in which the wire 50 is not attached. In the embodiment, the groove 31g extends along a region on which the wire 50 is to be attached. For example, the groove 31g has a shape corresponding to the plurality of the straight portions S and to the plurality of the connection portions C of the wire 50. When the wire 50 is attached on the bottom surface 31e of the semiconductor storage device 30B, the groove 31g functions as a guide groove that limits a position of the wire 50.

With this configuration, when the wire 50 is attached on the bottom surface 31e of the semiconductor storage device 30B, the groove 31g limits the position of the wire 50. That is, even when the wire 50 is put at a slightly misaligned position on the bottom surface 31e of the semiconductor storage device 30B, the wire 50 is guided by the groove 31g and is thereby disposed at a proper position. Accordingly, it is possible to lower a degree of position accuracy at which the wire 50 is disposed on the bottom surface 31e of the semiconductor storage device 30B. Accordingly, it is possible to improve manufacturability of the board unit 3B.

Fourth Embodiment

Next, a fourth embodiment will be described. The fourth embodiment is different from the first embodiment in that, a space between which the plurality of the solder balls 32 are arranged in the X direction is different from a space between which the plurality of the solder balls 32 are arranged in the Y direction. Configurations other than those described below are the same as in the first embodiment.

Figure 14:
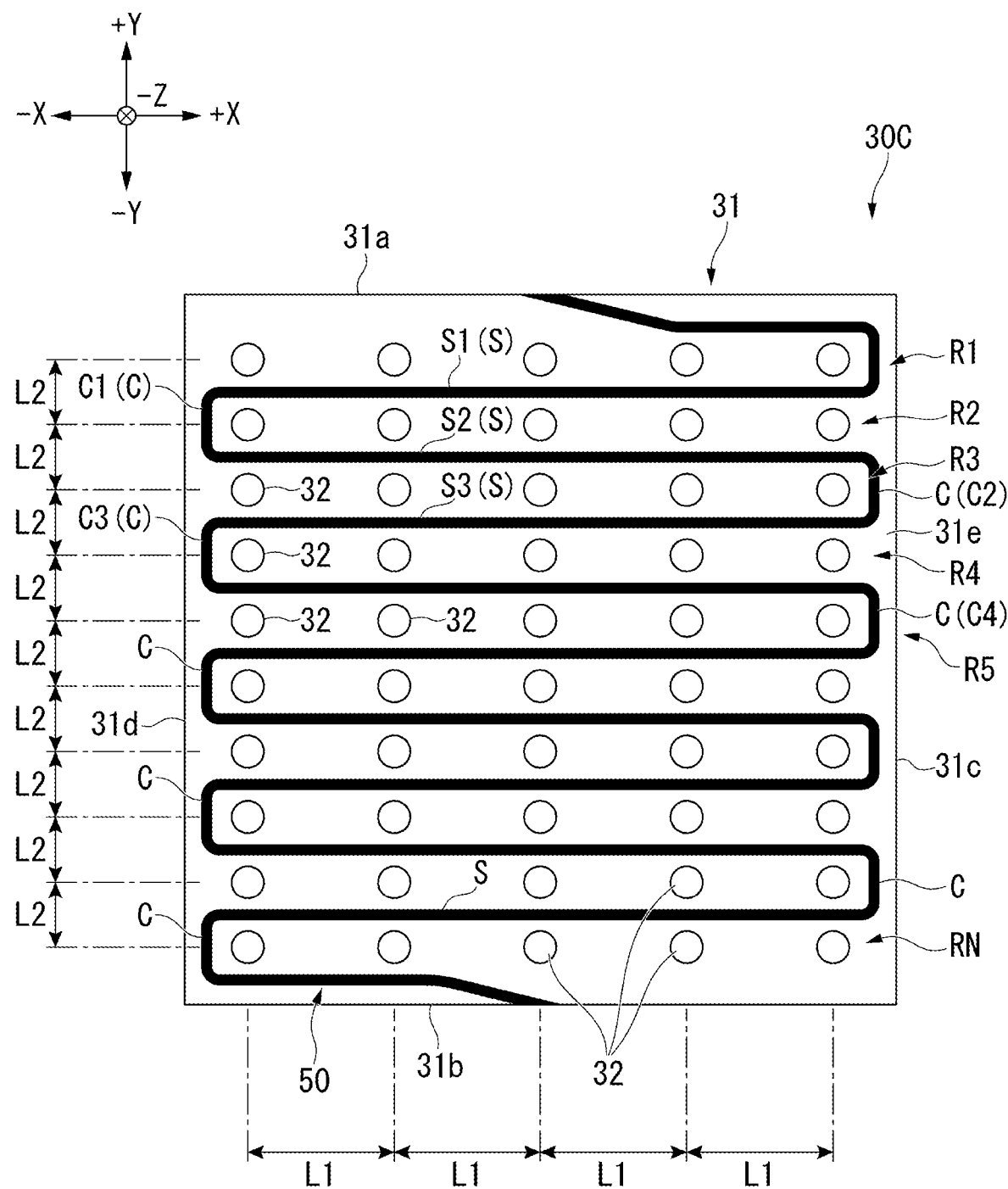
FIG. 14 is a bottom view showing a bottom surface of a semiconductor storage device and a wire according to a fourth embodiment.

FIG. 14 is a bottom view showing the bottom surface 31e of a semiconductor storage device 30C and the wire 50 according to the fourth embodiment. In the embodiment, the plurality of the solder balls 32 are arranged in the X direction at a first distance (first length) L1. On the other hand, the plurality of the solder balls 32 are arranged in the Y direction at a second distance (second length) L2. The second distance L2 is shorter than the first distance L1.

In the embodiment, the wire 50 has insulation. Here, when the plurality of the solder balls 32 are arranged in a grid pattern such that they extend in the X direction and the Y direction, it is conceivable that a structure in which the wire 50 is disposed between the two solder balls 32 aligning in the X direction and a structure in which the wire 50 is disposed between the two solder balls 32 aligning in the Y direction. In the embodiment, the wire 50 is not disposed between the two solder balls 32 aligning in the X direction (i.e., the two solder balls 32 are apart from each other at the first distance L1). The wire 50 is disposed between the two solder balls 32 aligning in the Y direction (i.e., the two solder balls 32 are apart from each other at the second distance L2).

With this configuration, of the plurality of the solder balls 32 arranged in the grid pattern, the wire 50 is disposed between the two solder balls 32 aligning at a relatively narrow distance. Consequently, a probability of short-circuiting between the two solder balls 32 aligning at a relatively narrow distance can be reduced by the insulating wire 50. As a result, it is possible to increase a process yield or reliability of the semiconductor storage device 30C.

Fifth Embodiment

Next, a fifth embodiment will be described. The fifth embodiment is different from the first embodiment in that the wire 50 is not attached between all ball rows R. Configurations other than those described below are the same as in the first embodiment.

Figure 15:
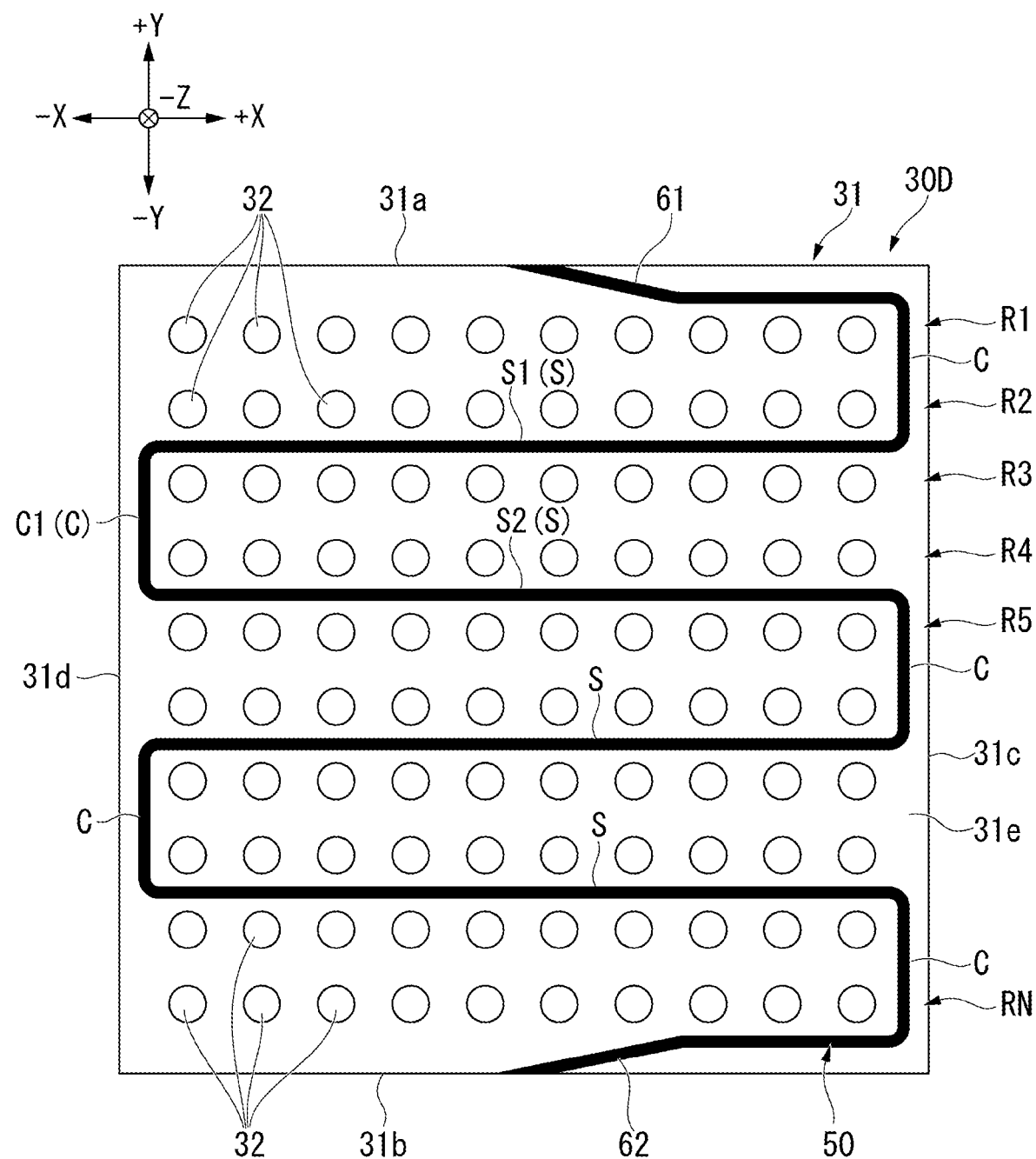
FIG. 15 is a bottom view showing a bottom surface of a semiconductor storage device and a wire according to a fifth embodiment.

FIG. 15 is a bottom view showing the bottom surface 31e of a semiconductor storage device 30D and the wire 50 according to the fifth embodiment. In the embodiment, the wire 50 is located between the two ball rows R adjacent to each other in the Y direction while one region extending in the X direction and having no wire is present between the two ball rows R. In other words, a region extending in the X direction is located between the third ball row R3 and the fourth ball row R4, and the wire 50 is not located on the region. For example, the wire 50 includes the first straight portion S1, the second straight portion S2, and the first connection portion C1. The first straight portion S1 is located between the second ball row R2 and the third ball row R3 and extends in parallel to the ball rows R2 and R3. The second straight portion S2 is located between the fourth ball row R4 and the fifth ball row R5 and extends in parallel to the ball rows R4 and R5. The first connection portion C1 connects the end portion of the first straight portion S1 and the end portion of the second straight portion S2. In the embodiment, the second ball row R2 is an example of "first row". The third ball row R3 is an example of "second row". The fifth ball row R5 is an example of "third row".

With this configuration, it is possible to reduce a workload for operation of disposing the wire 50 between the plurality of the ball rows R. Accordingly, it is possible to improve manufacturability. Note that, instead of one region extending in the X direction and having no wire being present between the two ball rows R, for example, two or three regions extending in the X direction and having no wire may be present on the bottom surface 31e.

Sixth Embodiment

Next, a sixth embodiment will be described. The sixth embodiment is different from the first embodiment in that a wire 50E is disposed on the bottom surface 31e in a spiral shape. Configurations other than those described below are the same as in the first embodiment.

Figure 16:
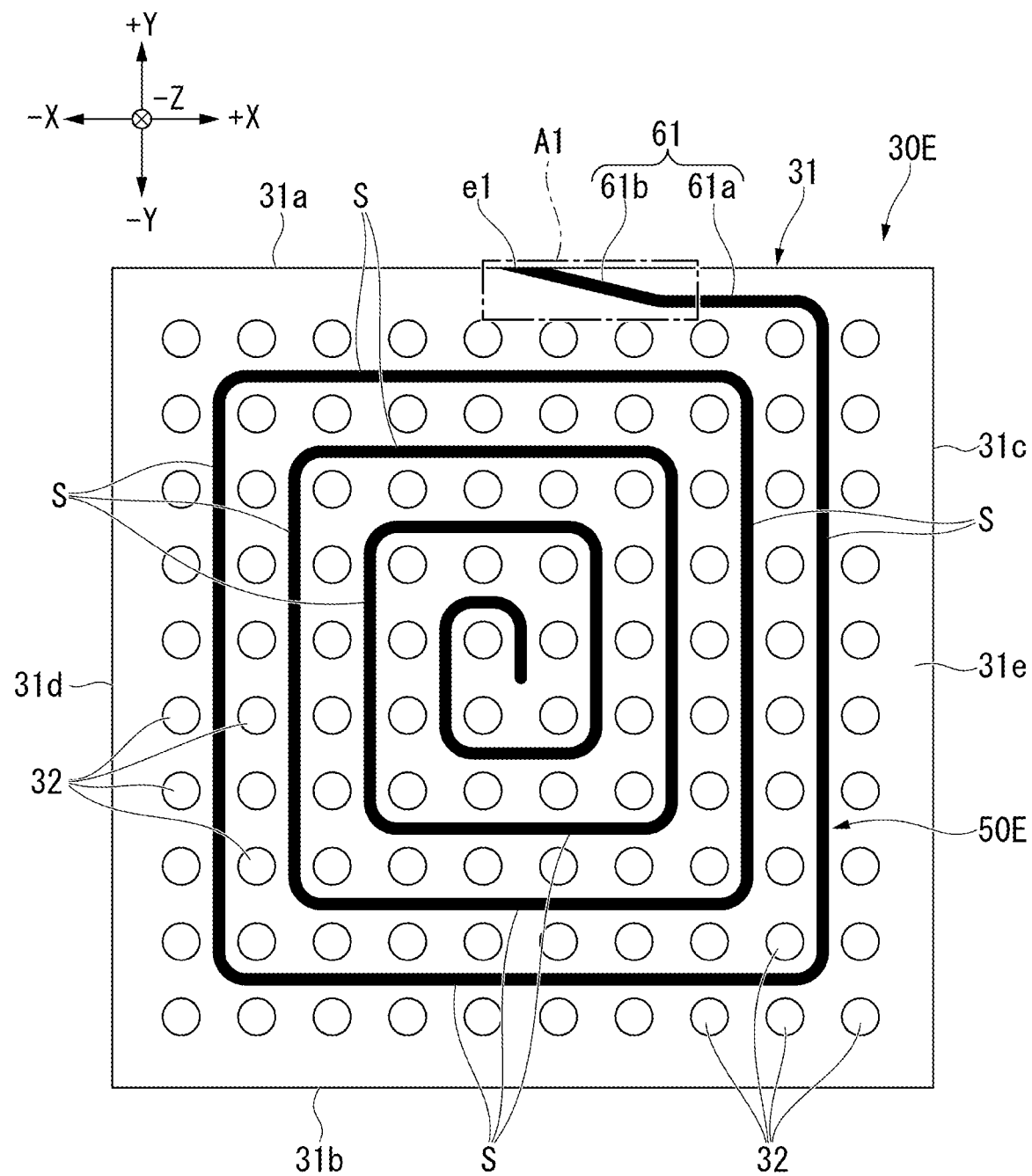
FIG. 16 is a bottom view showing a bottom surface of a semiconductor storage device and a wire according to a sixth embodiment.

FIG. 16 is a bottom view showing the bottom surface 31e of a semiconductor storage device 30E and the wire 50E according to the sixth embodiment. In the embodiment, the wire 50E is disposed in a spiral shape. For example, the wire 50E has a plurality of straight portions S, each of which extends along any one of the four side surfaces 31a, 31b, 31c, and 31d of the semiconductor storage device 30E. The plurality of the straight portions S are continuously disposed on the bottom surface 31e of the semiconductor storage device 30E while, for example, following a clockwise (or counterclockwise) so as to be gradually apart from the outer periphery of the semiconductor storage device 30E. Even with this configuration, when removal of the semiconductor storage device 30E from the circuit board 10 is necessary, the solder balls 32 are broken by pulling the wire 50E, and it is possible to remove the semiconductor storage device 30E from the circuit board 10.

Seventh Embodiment

Next, a seventh embodiment will be described. The seventh embodiment is different from the first embodiment in that the body part 31 of a semiconductor storage device 30F has an inclined portion 91. Configurations other than those described below are the same as in the first embodiment. Note that, the seventh embodiment may be realized by combination of the seventh embodiment and one or more embodiments selected from the second embodiment to the sixth embodiment and an eighth embodiment which will be described below.

Figure 17:
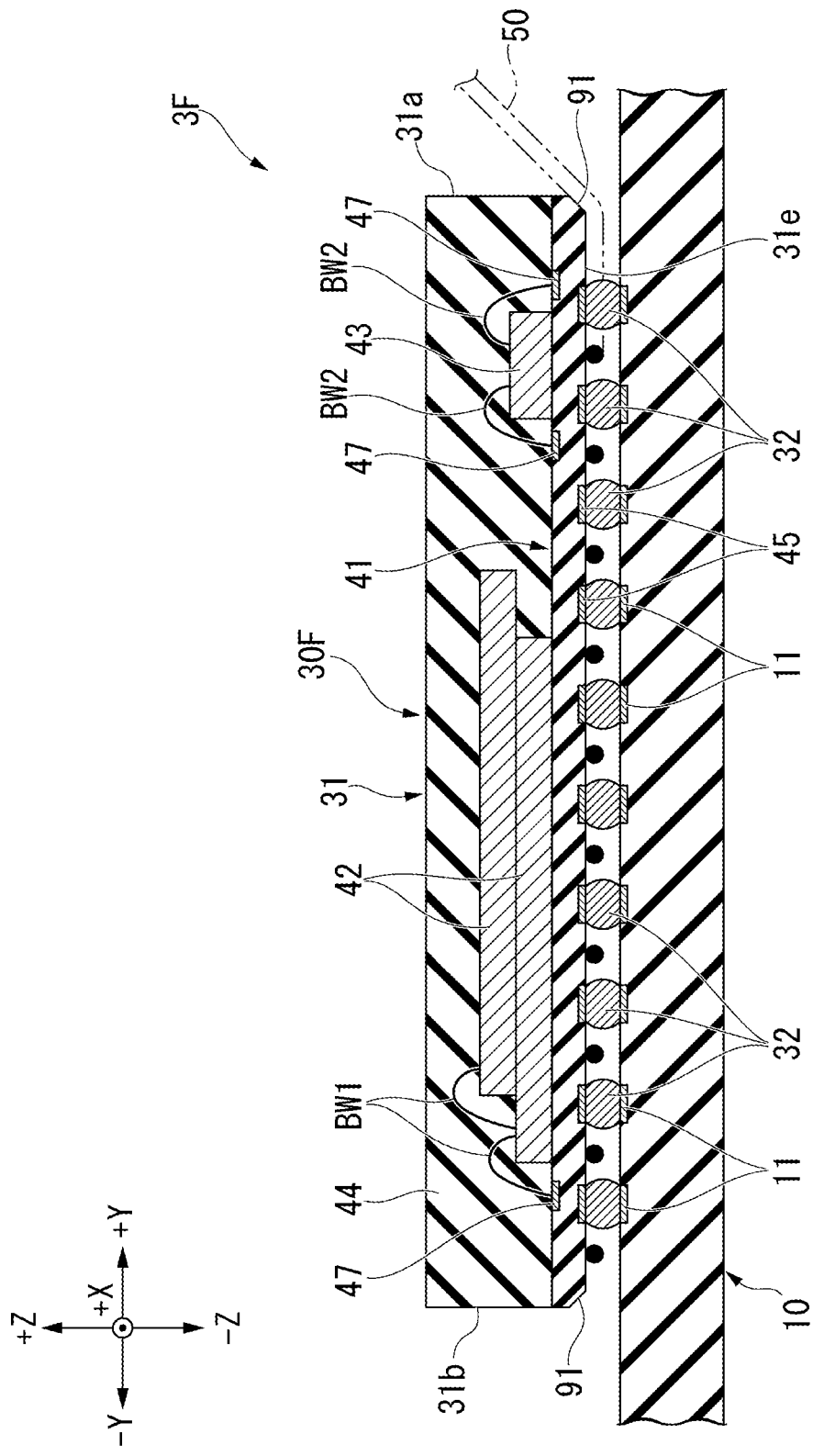
FIG. 17 is a cross-sectional view showing a part of a board unit according to a seventh embodiment.

FIG. 17 is a cross-sectional view showing a part of a board unit 3F according to the seventh embodiment. In the embodiment, the wire 50 is disposed in a way similar to the first embodiment. The bottom surface 31e of the body part 31 of the semiconductor storage device 30F includes the inclined portion 91. For example, the inclined portion 91 is provided at a lower end of the body part 31 (for example, a lower end of the package board 41) at the end portion on the side in the +Y direction and at the end portion on the side in the −Y direction of the body part 31. The inclined portion 91 that is provided at the end portion on the side in the +Y direction has an outside-inclined end located at the end portion on the side in the +Y direction and an inside-inclined end located at the end portion on the side in the −Z direction. This inclined portion 91 is a portion formed between the outside-inclined end and the inside-inclined end at the side in the +Y direction. This inclined portion 91 extends from the outside-inclined end to the inside-inclined end, that is, in an oblique direction inclined with respect to the +Y direction and the −Z direction. Similarly, the inclined portion 91 that is provided at the end portion on the side in the −Y direction has an outside-inclined end located at the end portion on the side in the −Y direction and an inside-inclined end located at the end portion on the side in the −Z direction. This inclined portion 91 is a portion formed between the outside-inclined end and the inside-inclined end at the side in the −Y direction. This inclined portion 91 extends from the outside-inclined end to the inside-inclined end, that is, in an oblique direction inclined with respect to the −Y direction and the −Z direction. In other words, the inclined portion 91 is inclined so as to be positioned at the side in the +Z direction with separating from the center portion of the body part 31 in the Y direction toward the +Y direction or the −Y direction. The inclined portion 91 may be an inclined portion having a linear portion or may be an inclined portion having a rounded portion. Furthermore, the inclined portion 91 that is the same as described above may be provided at a lower end of the body part 31 (for example, a lower end of the package board 41) at the end portion on the side in the +X direction and at the end portion on the side in the −X direction of the body part 31. In this case, the inclined portion 91 that is provided at the end portion on the side in the +X direction has an outside-inclined end located at the end portion on the side in the +X direction and an inside-inclined end located at the end portion on the side in the −Z direction. The inclined portion 91 that is provided at the end portion on the side in the −X direction has an outside-inclined end located at the end portion on the side in the −X direction and an inside-inclined end located at the end portion on the side in the −Z direction. This inclined portion 91 extends from the outside-inclined end to the inside-inclined end, that is, in an oblique direction inclined with respect to the X direction and the Z direction. In other words, the inclined portion 91 is inclined so as to be positioned at the side in the +Z direction with separating from the center portion of the body part 31 in the X direction toward the +X direction or the −X direction.

With this configuration, when the wire 50 is pulled to the outer periphery of the semiconductor storage device 30F, the wire 50 is pulled along the inclined portion 91. Consequently, the wire 50 is less likely to be in contact with an acute corner portion having, for example, a right angle or a sharp angle with respect to the bottom surface 31e. Therefore, in operation of pulling the wire 50, it is possible to prevent breaking the wire 50 in the middle thereof. Consequently, it is possible to further increase a degree of workability of the peeling operation of the semiconductor storage device 30F from the circuit board 10.

Eighth Embodiment

Next, an eighth embodiment will be described. The eighth embodiment is different from the first embodiment in that the wire 50 is provided on the circuit board 10. Configurations other than those described below are the same as in the first embodiment.

Figure 18:
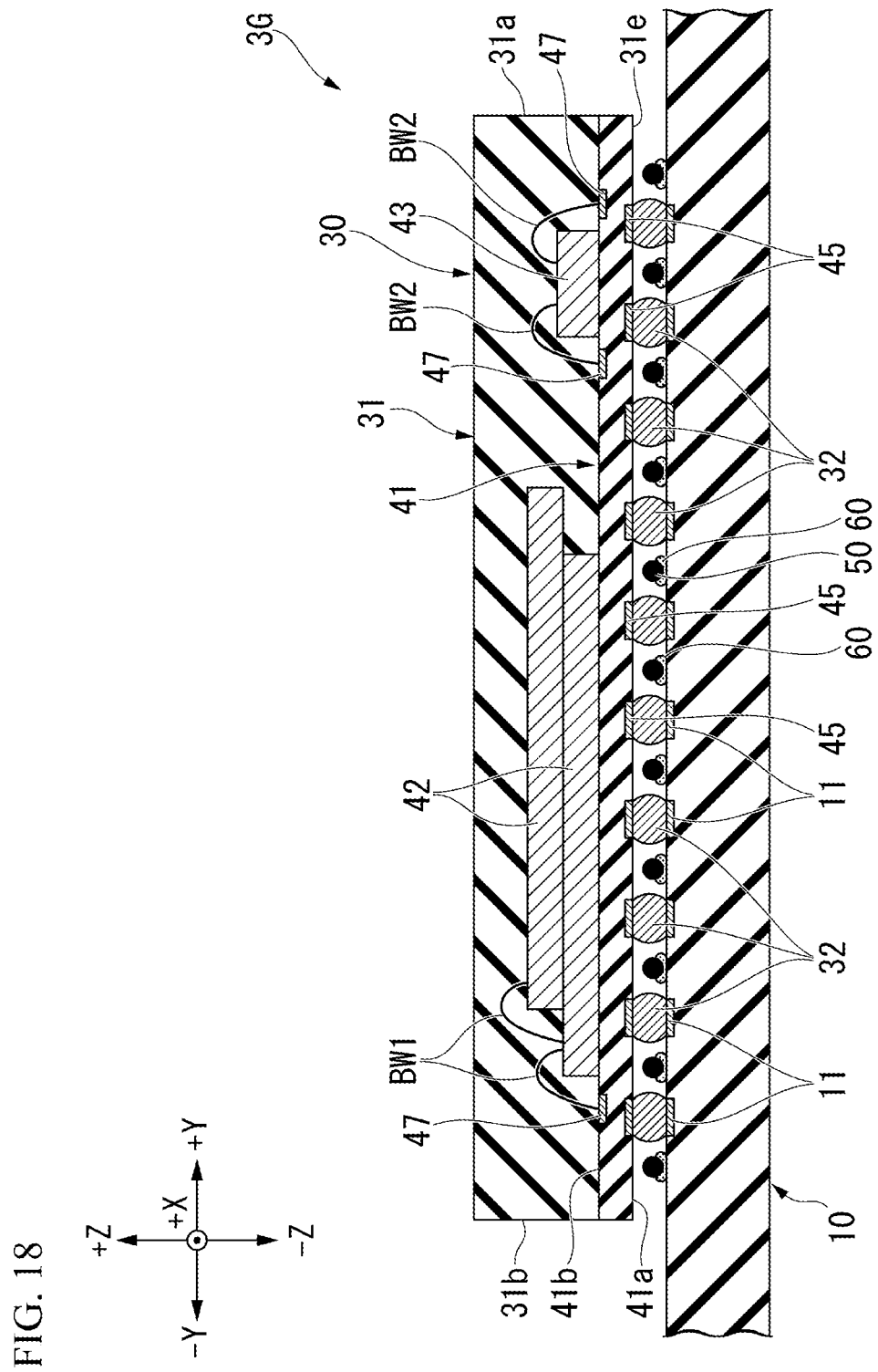
FIG. 18 is a cross-sectional view showing a part of a board unit according to an eighth embodiment.

FIG. 18 is a cross-sectional view showing a part of a board unit 3G according to the eighth embodiment. The wire 50 is fixed on a surface of the circuit board 10 via, for example, the adhesive 60 that is the same as that of the first embodiment. In the embodiment, the wire 50 is fixed on a surface of the insulating layer 12 of the circuit board 10 (for example, a solder resist layer, refer to FIG. 3) via the adhesive 60. The arrangement of the wire 50 when viewed from the Z direction is, for example, the same as that of the first embodiment. Note that, when viewed from the Z direction, the wire 50 according to the embodiment may extend outward to the outer periphery further than the semiconductor storage device 30.

Figure 19A:
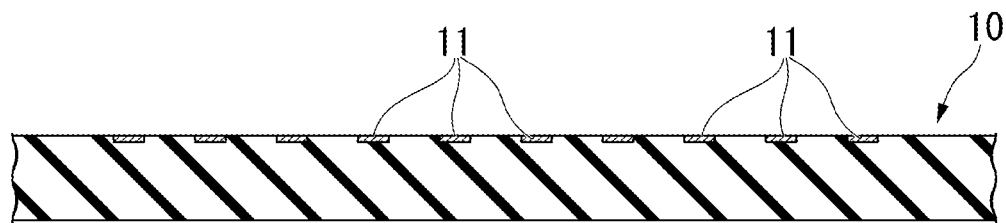
FIGS. 19A to 19C are cross-sectional views for explaining a method of manufacturing the board unit according to the eighth embodiment.
Figure 19B:
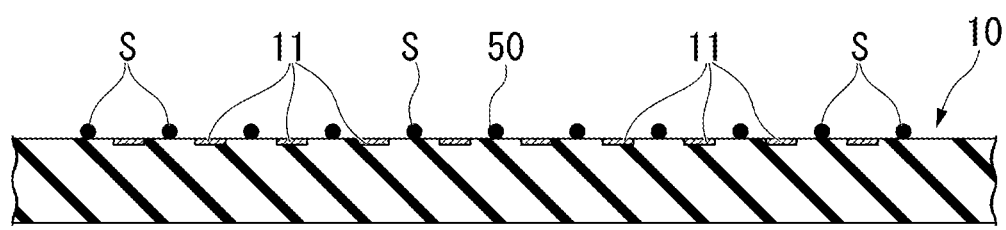
Figure 19C:
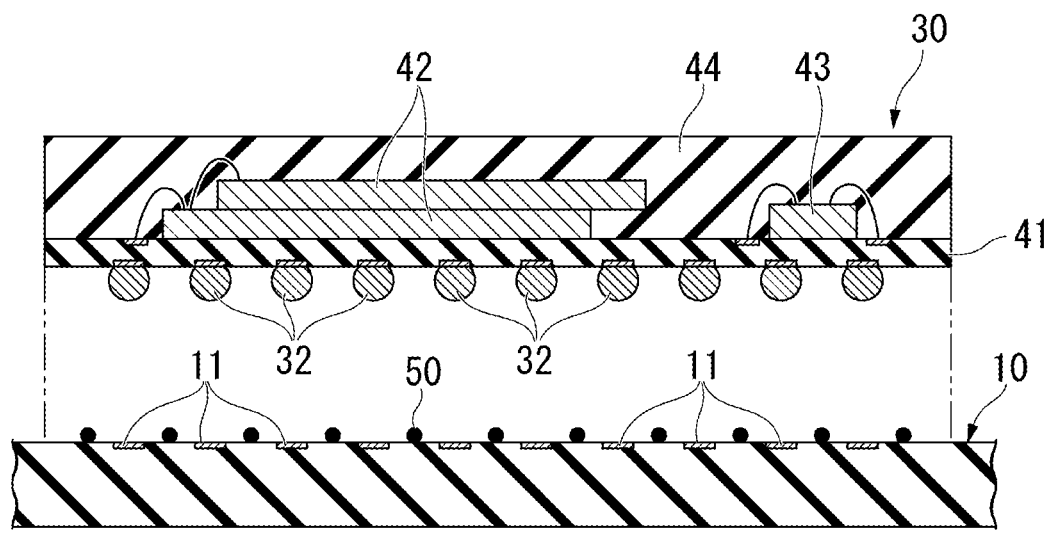

FIGS. 19A to 19C are cross-sectional explanatory views of a method of manufacturing the board unit 3G according to the eighth embodiment. First of all, as shown in FIG. 19A, the circuit board 10 is prepared. The plurality of pads 11 are provided on the circuit board 10. Next, as shown in FIG. 19B, the wire 50 is attached on a surface of the circuit board 10. At this time, the wire 50 is attached at a position which avoids the plurality of the pads 11. Next, as shown in FIG. 19C, the semiconductor storage device 30 is mounted on the circuit board 10 while causing the wire 50 to be positioned between the semiconductor storage device 30 and the circuit board 10. Consequently, the board unit 3G is completed.

With this configuration, it is easy to peel the semiconductor storage device 30 from the circuit board 10 in a way similar to the first embodiment. Furthermore, according to the embodiment, it is not necessary to carry out operation of attaching the wire 50 on the bottom surface 31e of the semiconductor storage device 30 while avoiding the plurality of the solder balls 32. Accordingly, it may be possible to improve manufacturability of the board unit 3G.

First Modified Example of Eighth Embodiment

In the second embodiment described above with reference to FIG. 10, the adhesive sheet 80 having at least a part of the wire 50 implanted therein is provided on the bottom surface 31e of the semiconductor storage device 30. Therefore, the wire 50 is fixed on the bottom surface 31e of the semiconductor storage device 30. Instead of this, in the first modified example of the eighth embodiment, the adhesive sheet 80 having at least a part of the wire 50 implanted therein is provided on a surface of the circuit board 10. Accordingly, the wire 50 is fixed on the surface of the circuit board 10. With this configuration, it is possible to further improve manufacturability of the board unit 3G.

Second Modified Example of Eighth Embodiment

Figure 20:
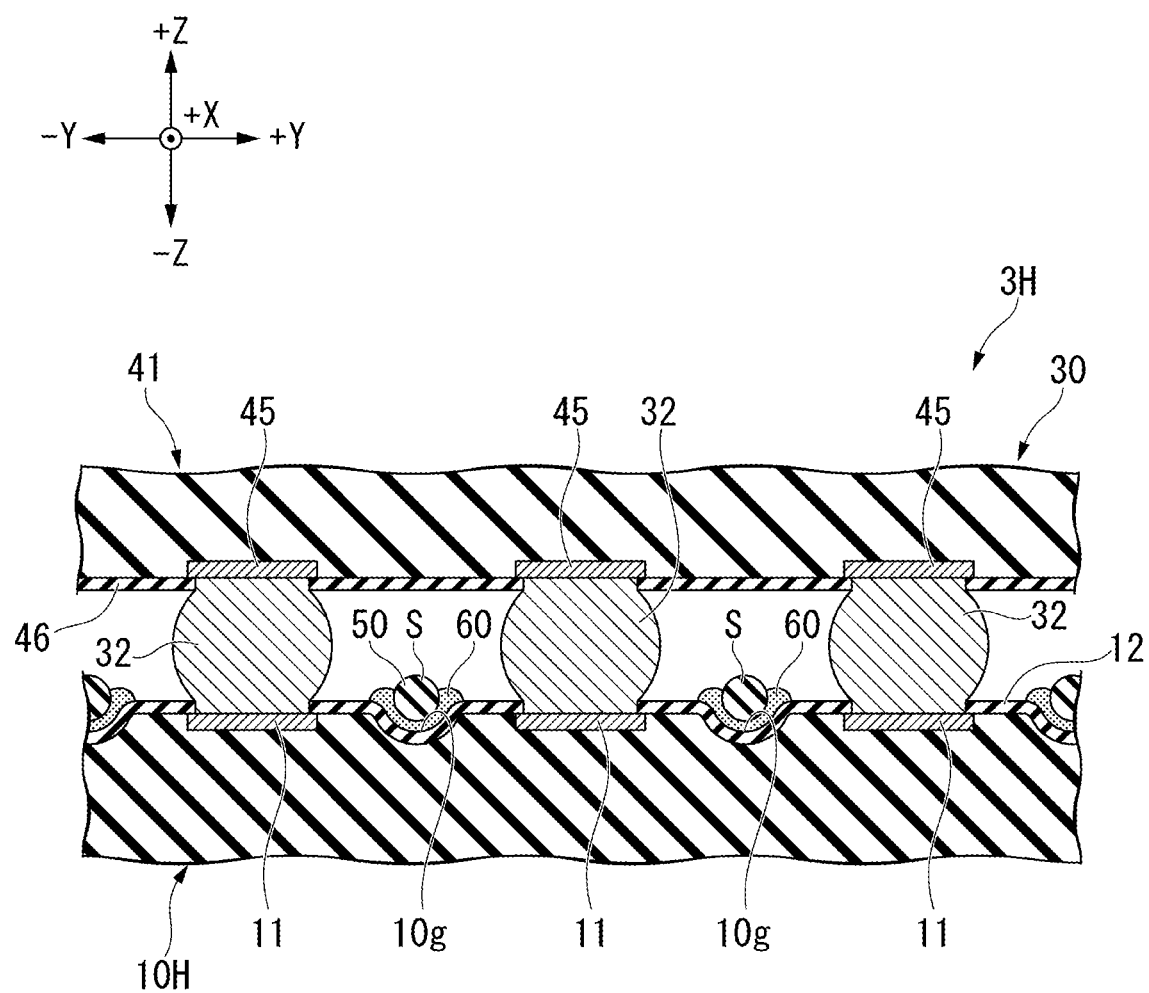
FIG. 20 is a cross-sectional view showing a part of a board unit according to a second modified example of the eighth embodiment

FIG. 20 is a cross-sectional view showing a part of the board unit 3H according to the second modified example of the eighth embodiment. In the aforementioned third embodiment, the groove 31g is provided along the wire 50 on the bottom surface 31e of the semiconductor storage device 30B. Instead of this, in the second modified example of the eighth embodiment, a groove 10g that is the same as the groove 31g is provided on a surface of a circuit board 10H. The groove 10g is provided at a position at which the wire 50 is attached. The groove 10g is depressed in a direction away from the semiconductor storage device 30 (−Z direction). That is, the groove 10g is depressed from the surface of the circuit board 10H toward the inside of the circuit board 10H in a thickness direction (Z direction). For example, a part of the adhesive 60 and a part of the wire 50 are accommodated in the groove 10g. When viewed from the Z direction, the groove 10g has the same configuration as, for example, the groove 31g described in the second embodiment. When the wire 50 is attached on the surface of the circuit board 10H, the groove 10g functions as a guide groove that limits a position of the wire 50.

With this configuration, when the wire 50 is attached on the surface of the circuit board 10H, the groove 10g limits the position of the wire 50. That is, even when the wire 50 is put at a slightly misaligned position on the surface of the circuit board 10H, the wire 50 is guided by the groove 10g and is thereby disposed at a proper position. Accordingly, it is possible to lower a degree of position accuracy at which the wire 50 is disposed on the surface of the circuit board 10H. Accordingly, it is possible to improve manufacturability of the board unit 3H.

While some embodiments and modified examples have been described above, the embodiments and the modified examples are not limited to the above examples. For example, the embodiments and the modified examples described above may be realized by suitable combination thereof with each other.

According to at least one of the embodiments described above, the wire includes a part disposed between the first row and the second row. Each of the first row and the second row includes a plurality of bonding members. The first row and the second row are adjacent to each other. Furthermore, the strength of the wire is higher than that of one of the plurality of the bonding members. With this configuration, it is easy to peel a semiconductor device from a circuit board.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A board unit comprising:
   a circuit board;
   a semiconductor device having a bottom surface facing the circuit board, the semiconductor device including a plurality of bonding members, the plurality of the bonding members being between the circuit board and the bottom surface, the plurality of the bonding members being connected to the circuit board; and
   a wire between the circuit board and the bottom surface, wherein
   the plurality of the bonding members have a first row and a second row,
   of the plurality of the bonding members, two or more bonding members align in the first row in a first direction,
   of the plurality of the bonding members, two or more bonding members align in the second row in the first direction,
   the second row is apart from the first row in a second direction intersecting with the first direction,
   the wire includes a first portion between the first row and the second row, and
   the wire has a strength higher than that of one of the plurality of the bonding members.

2. The board unit according to claim 1, wherein
   the plurality of the bonding members have a third row,
   the third row is at an opposite side of the first row with respect to the second row in the second direction,
   of the plurality of the bonding members, two or more bonding members align in the third row in the first direction,
   the wire includes a second portion and a third portion,
   the second portion is between the second row and the third row, and
   the third portion connects an end portion of the first portion and an end portion of the second portion.

3. The board unit according to claim 1, wherein
   the wire is fixed on the bottom surface.

4. The board unit according to claim 3, wherein
   the bottom surface includes a groove extending along the wire.

5. The board unit according to claim 1, wherein
   the wire is fixed to the circuit board.

6. The board unit according to claim 5, wherein
   the circuit board includes a groove extending along the wire.

7. The board unit according to claim 1, wherein
   the semiconductor device has a side surface,
   the side surface forms a part of an outer shape of the semiconductor device, and
   when viewed from a thickness direction of the circuit board, the wire has an end portion that reaches the side surface.

8. The board unit according to claim 1, wherein
   the wire has insulation.

9. The board unit according to claim 8, wherein
   the plurality of the bonding members align in the first direction and are spaced apart at a first distance,
   the plurality of the bonding members align in the second direction and are spaced apart at a second distance,
   the second distance is shorter than the first distance,
   the wire is between the first row and the second row, and
   the first row is spaced apart from the second row at the second distance.

10. The board unit according to claim 1, wherein
    the semiconductor device includes a semiconductor component and a sealing resin part,
    the sealing resin part seals the semiconductor component,
    the wire includes a material having a coefficient of thermal conductivity higher than that of a material included in the sealing resin part.

11. The board unit according to claim 1, wherein
    the wire includes a material having a coefficient of thermal conductivity higher than that of copper.

12. The board unit according to claim 1, further comprising:
    an adhesive sheet on the bottom surface or the circuit board, the adhesive sheet having a plurality of opening portions, wherein
    each of the opening portions has a size such that at least one of the plurality of the bonding members pass through one opening portion, and
    the adhesive sheet includes the wire.

13. A semiconductor device comprising:
    a body part having a bottom surface, the body part including a semiconductor component;
    a plurality of bonding members on the bottom surface; and
    a wire fixed on the bottom surface, wherein
    the plurality of the bonding members have a first row and a second row,
    of the plurality of the bonding members, two or more bonding members align in the first row in a first direction,
    of the plurality of the bonding members, two or more bonding members align in the second row in the first direction,
    the second row is apart from the first row in a second direction intersecting with the first direction,
    the wire includes a first portion between the first row and the second row, and
    the wire has a strength higher than that of one of the plurality of the bonding members.

14. The semiconductor device according to claim 13, wherein
    the plurality of the bonding members have a third row,
    the third row is at an opposite side of the first row with respect to the second row in the second direction,
    of the plurality of the bonding members, two or more bonding members align in the third row in the first direction, the wire includes a second portion and a third portion,
the second portion is between the second row and the third row, and
the third portion connects an end portion of the first portion and an end portion of the second portion.

15. The semiconductor device according to claim 13, wherein
the wire is fixed on the bottom surface.

16. The board unit according to claim 13, wherein
the wire is fixed to the circuit board.

17. A semiconductor device comprising:
a circuit board;
a semiconductor device having a bottom surface facing the circuit board;
a plurality of bonding members between the circuit board and the bottom surface, the plurality of bonding members being connected to the circuit board and the bottom surface; and
a wire between the circuit board and the bottom surface, wherein
the plurality of the bonding members have a first row and a second row,
of the plurality of the bonding members, two or more bonding members align in the first row in a first direction,
of the plurality of the bonding members, two or more bonding members align in the second row in the first direction,
the second row is apart from the first row in a second direction intersecting with the first direction,
the wire includes a first portion between the first row and the second row, and
the wire has a strength higher than that of one of the plurality of the bonding members.

18. The board unit according to claim 17, wherein
the plurality of the bonding members have a third row,
the third row is at an opposite side of the first row with respect to the second row in the second direction,
of the plurality of the bonding members, two or more bonding members align in the third row in the first direction,
the wire includes a second portion and a third portion,
the second portion is between the second row and the third row, and
the third portion connects an end portion of the first portion and an end portion of the second portion.

19. The board unit according to claim 17, wherein
the wire is fixed on the bottom surface.

20. The board unit according to claim 17, wherein
the wire is fixed to the circuit board.

* * * * *